(12) United States Patent
Shimane et al.

(10) Patent No.: US 8,369,152 B2
(45) Date of Patent: Feb. 5, 2013

(54) SEMICONDUCTOR MEMORY DEVICE INCLUDING CHARGE ACCUMULATION LAYER

(75) Inventors: Takeshi Shimane, Matsudo (JP);
Naoyuki Shigyo, Yokohama (JP);
Mutsuo Morikado, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 286 days.

(21) Appl. No.: 12/817,665

(22) Filed: Jun. 17, 2010

(65) Prior Publication Data

US 2010/0322009 A1  Dec. 23, 2010

(30) Foreign Application Priority Data

Jun. 18, 2009  (JP) ................................ 2009-145471
Apr. 21, 2010  (JP) ................................ 2010-098188

(51) Int. Cl.
*G11C 11/34* (2006.01)
*G11C 16/04* (2006.01)
*G11C 16/06* (2006.01)

(52) U.S. Cl. ......... 365/185.18; 365/185.17; 365/185.24; 257/324; 257/E29.309

(58) Field of Classification Search ............. 365/185.18, 365/185.17, 185.24; 257/324, E29.309
See application file for complete search history.

(56) References Cited

U.S. PATENT DOCUMENTS

| 6,980,471 B1 * | 12/2005 | Samachisa | 365/185.02 |
| 7,006,379 B2 * | 2/2006 | Noguchi et al. | 365/185.17 |
| 2008/0239822 A1 * | 10/2008 | Kosaki et al. | 365/185.17 |

FOREIGN PATENT DOCUMENTS

| JP | 11-40764 | 2/1999 |
| JP | 11-145304 | 5/1999 |
| JP | 3522836 | 2/2004 |

* cited by examiner

*Primary Examiner* — Toan Le
(74) *Attorney, Agent, or Firm* — Oblon, Spivak, McClelland, Maier & Neustadt, L.L.P.

(57) ABSTRACT

According to one embodiment, a semiconductor memory device includes a semiconductor substrate, memory cells without a source region and a drain region, and a first insulating film. The memory cells are arranged adjacent to one another on the semiconductor substrate and include a first gate electrode including a charge accumulation layer. A current path functioning as a source region or a drain region of a selected memory cell is formed in the semiconductor substrate when a voltage is applied to the first gate electrode of one of unselected memory cells. The first insulating film is formed on the semiconductor substrate to fill a region between the first gate electrodes of the memory cells adjacent to each other.

22 Claims, 23 Drawing Sheets

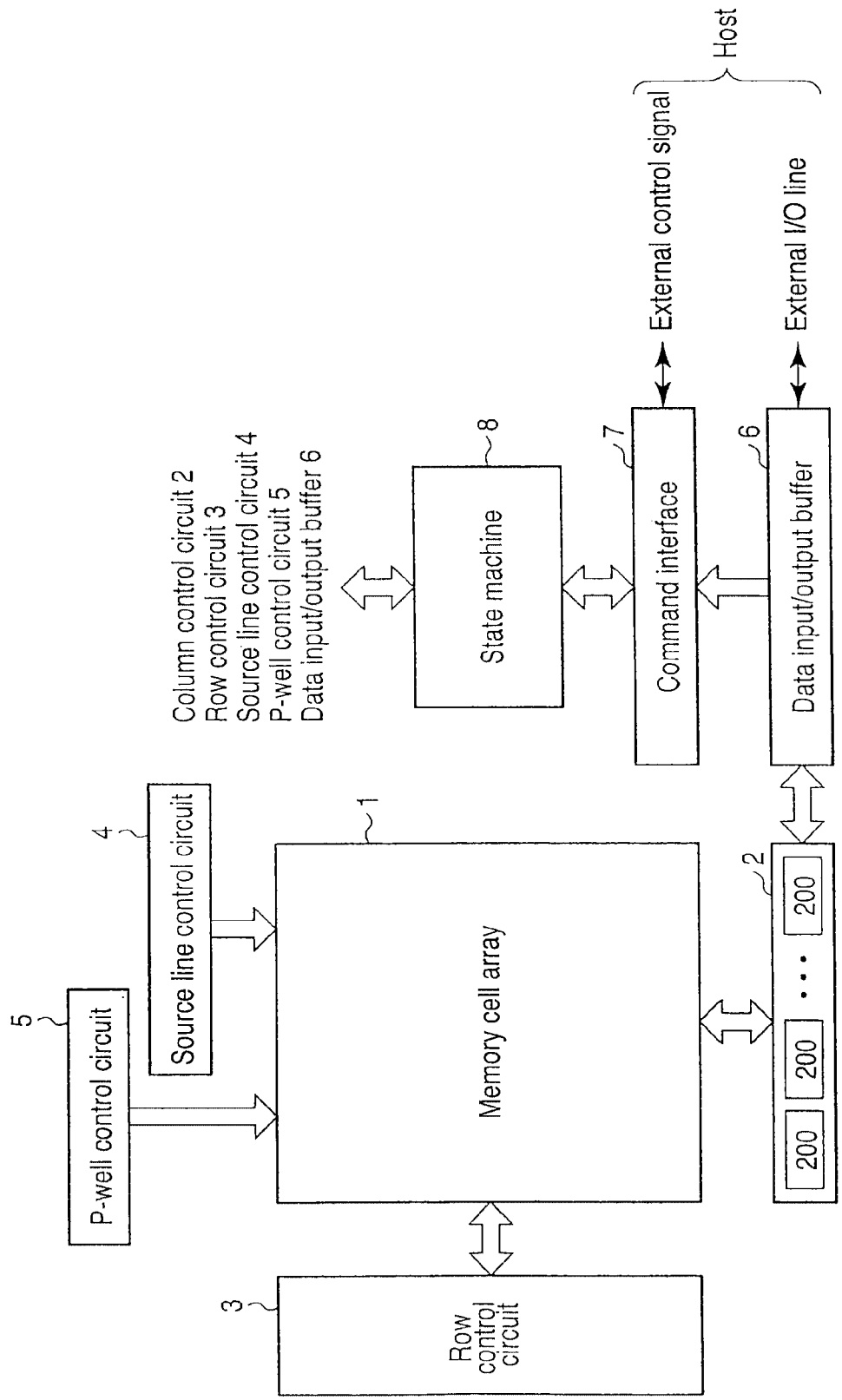
F I G. 1

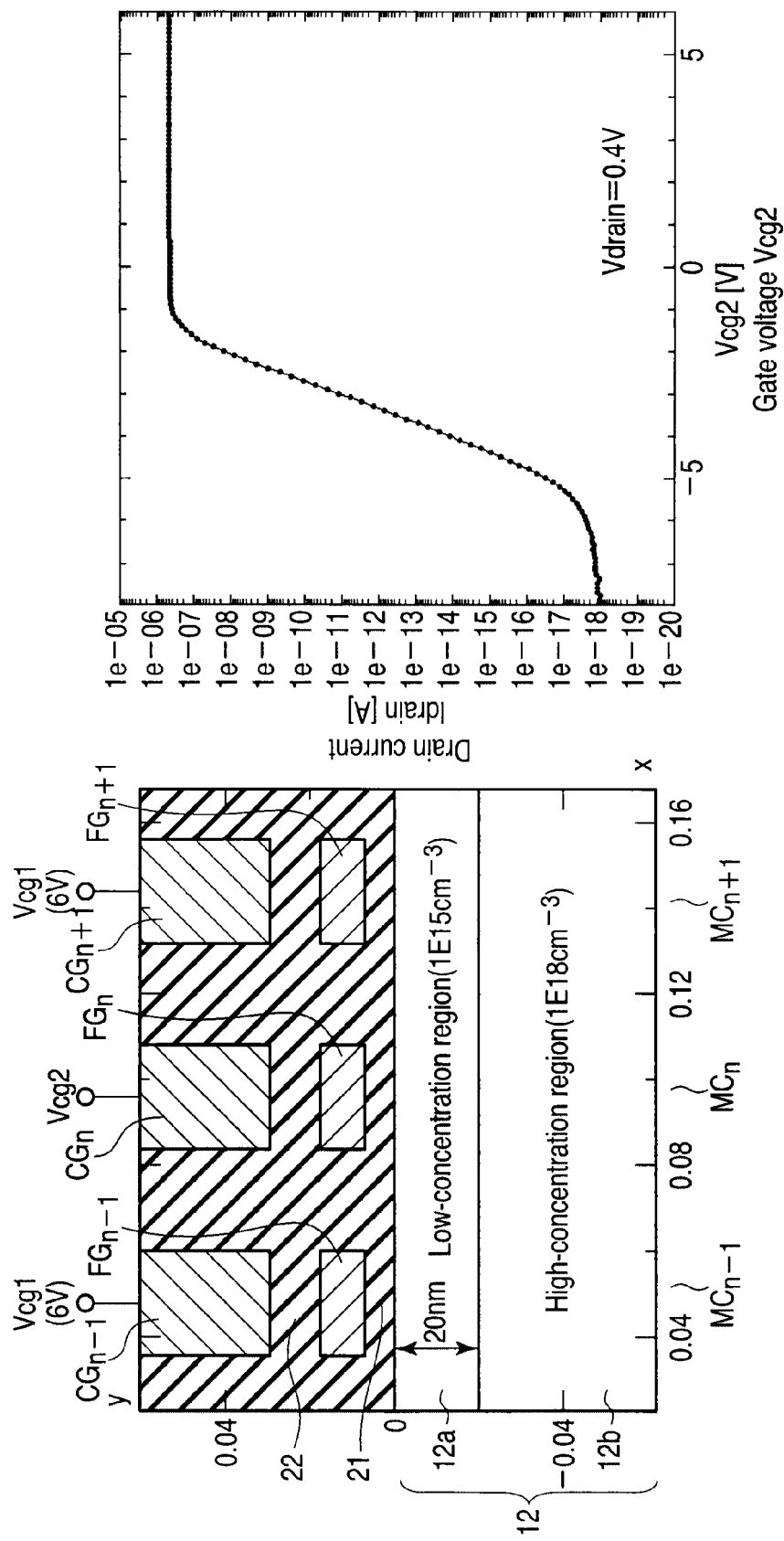
F I G. 9A
F I G. 9B

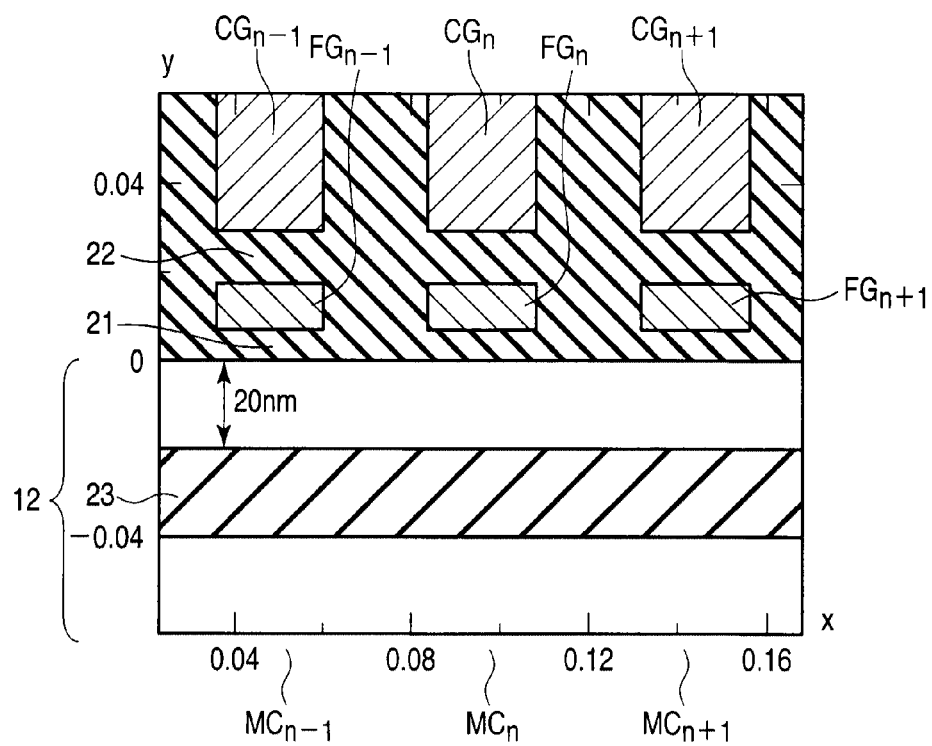
F I G. 11
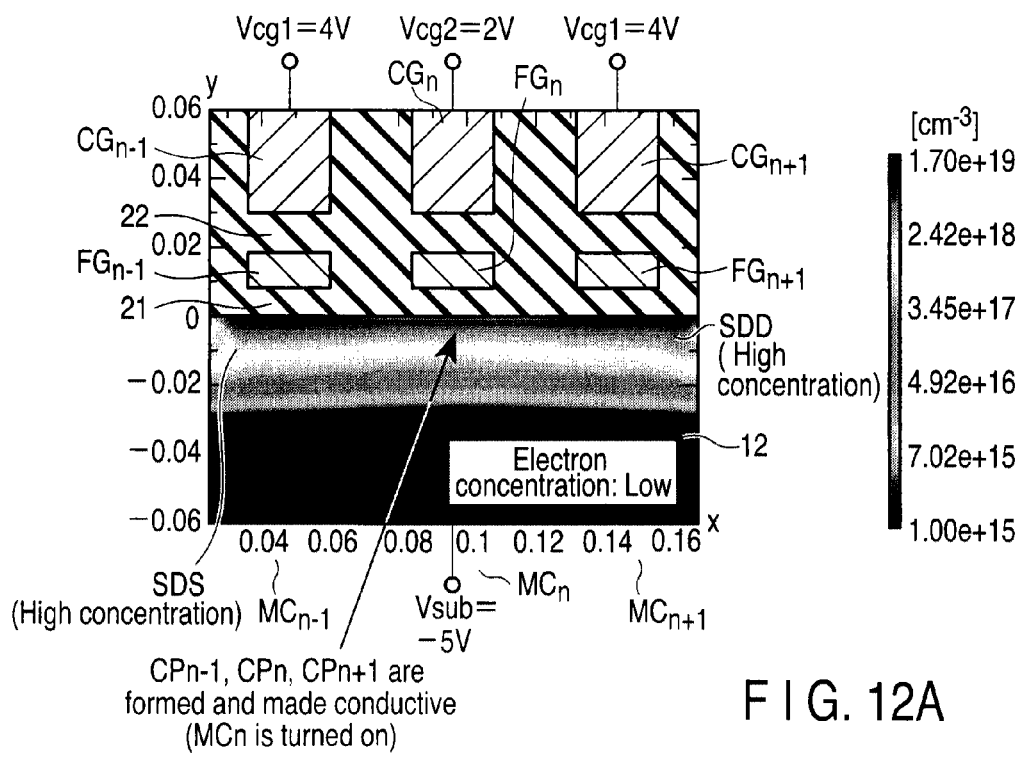
F I G. 12A

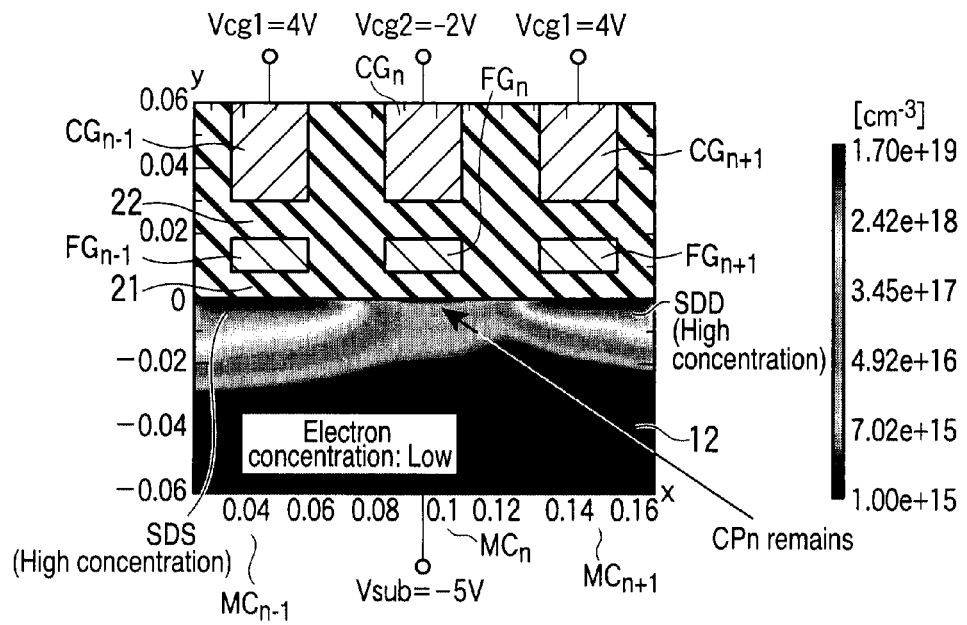
F I G. 12B
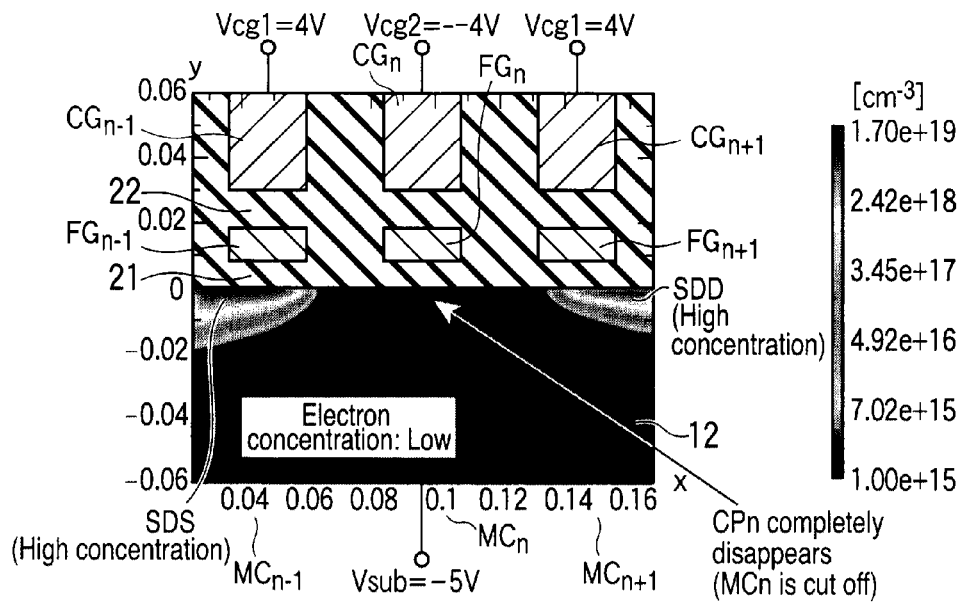
F I G. 12C

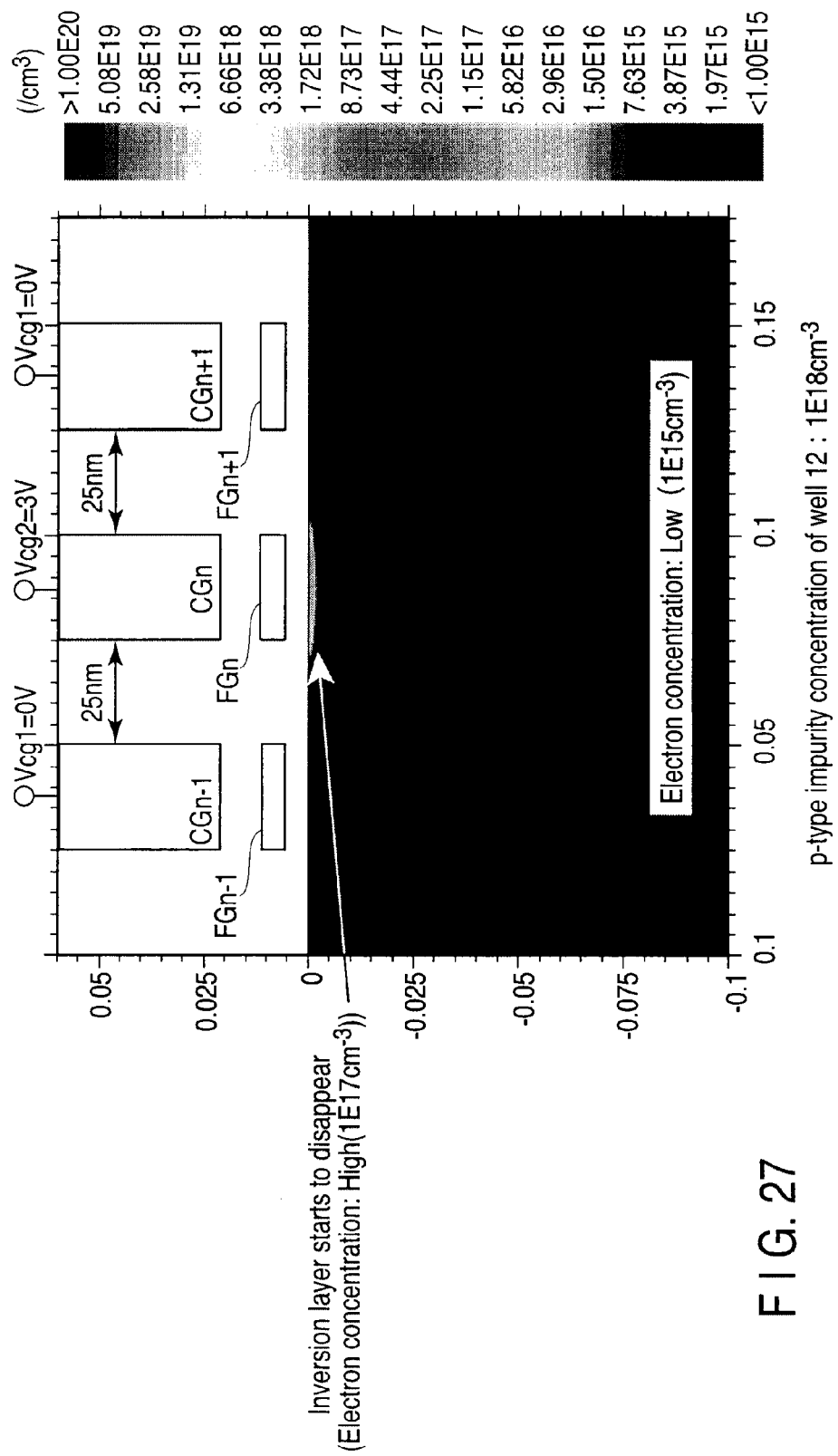
F I G. 27

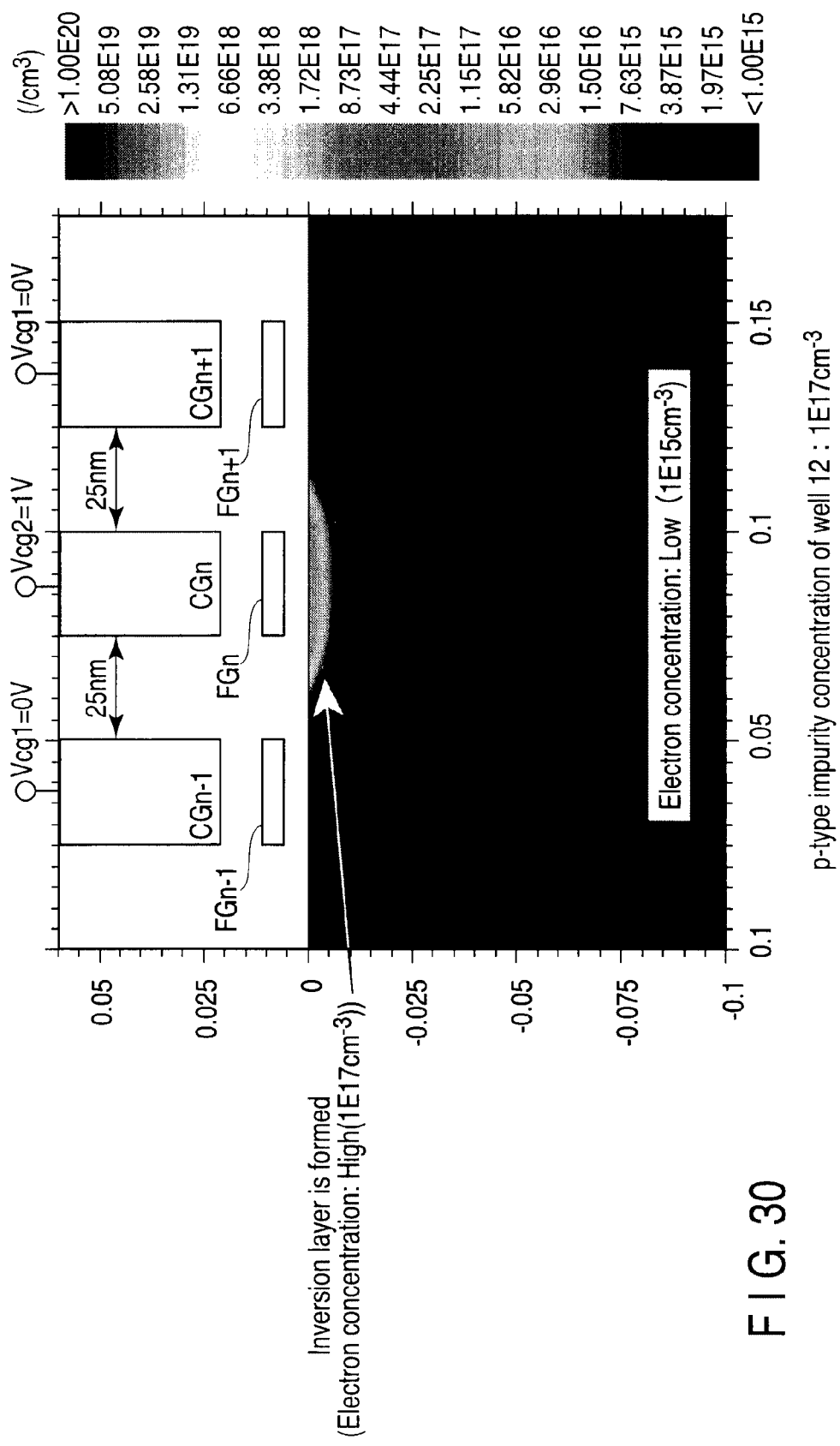
F I G. 30

SEMICONDUCTOR MEMORY DEVICE INCLUDING CHARGE ACCUMULATION LAYER

CROSS-REFERENCE TO RELATED APPLICATIONS

This application is based upon and claims the benefit of priority from Japanese Patent Applications No. 2009-145471, filed Jun. 18, 2009; and No. 2010-098188, filed Apr. 21, 2010; the entire contents of both of which are incorporated herein by reference.

FIELD

Embodiments described herein relate generally to a semiconductor memory device including charge accumulation layer, for example, a NAND cell EEPROM (NAND flash memory) with nonvolatile memory cells including no impurity diffusion layers (source regions and drain regions).

BACKGROUND

Conventionally, a NAND flash memory in which data can be electrically rewritten utilizes metal-oxide-semiconductor (MOS) transistors each having a stacked gate structure formed by stacking a charge accumulation layer (ex. floating gate) and control gate as nonvolatile memory elements (flash memory cells). For example, the data write operation is performed by injecting electrons into the floating gate to change the threshold voltage (Vth) of the MOS transistor. The data read operation is performed by sensing a cell current that varies according to a variation in the threshold voltage of the MOS transistor, that is, injection/non-injection of electrons into the floating gate by a sense amplifier.

In the above NAND flash memory, the flash memory cell is increasingly miniaturized. Therefore, an attempt is made to miniaturize the chip or increase the memory capacity of each chip. However, an influence of each atom becomes significant with miniaturization of the flash memory cell and there occurs a problem that a variation in the threshold value becomes larger due to fluctuation of impurities.

As a method for reducing fluctuation of the impurities, a method for lowering (thinning) the impurity concentration of a substrate surface that becomes an inversion layer of a channel portion in a metal-insulator-semiconductor field effect transistor (MISFET) is already proposed. Such a proposal is disclosed in Jpn. Pat. Appln. KOKAI Publications No. H11-40764 and No. H11-145304, for example.

However, if the impurity concentration of the channel portion is lowered, the source region and drain region of the MISFET tend to be electrically connected. Particularly, since the distance between the source region and drain region becomes smaller (shorter) if miniaturization is further advanced, they tend to be electrically connected more easily. If the source region and drain region between the flash memory cells are electrically connected, the MISFET cannot function as a flash memory cell.

Further, the structure of a MISFET in which source regions and drain regions are not formed is also proposed. Such a proposal is disclosed in Japanese Patent No. 3,522,836, for example. However, with this structure, it is necessary to provide a conductive layer between gate electrodes of adjacent MISFETs.

BRIEF DESCRIPTION OF THE DRAWINGS

FIG. 1 is a block diagram showing an example of the configuration of a nonvolatile semiconductor memory device (NAND flash memory) according to a first embodiment;

FIG. 9A is a cross-sectional view of flash memory cells according to a second embodiment;

FIG. 9B is a graph showing a current-voltage (IV) characteristic of the flash memory cell according to the second embodiment;

FIG. 11 is a cross-sectional view showing an example of the structure of flash memory cells according to a third embodiment;

FIGS. 12A, 12B and 12C are cross-sectional views showing flash memory cells according to a fourth embodiment;

FIGS. 24 to 30 are cross-sectional views showing flash memory cells according to modifications of the first embodiment.

DETAILED DESCRIPTION

Figure 2:
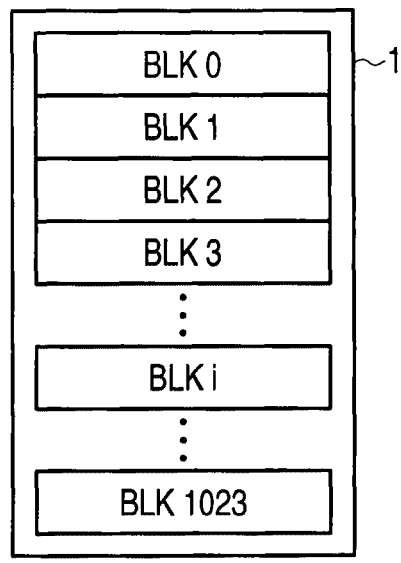
FIG. 2 is a block diagram showing an example of the configuration of a memory cell array in the NAND flash memory of FIG. 1.

In general, according to one embodiment, a semiconductor memory device includes a semiconductor substrate; memory cells without a source region and a drain region; and a first insulating film. The memory cells are arranged adjacent to one another on the semiconductor substrate and include a first gate electrode including a charge accumulation layer. A current path functioning as a source region or a drain region of a selected memory cell is formed in the semiconductor substrate when a voltage is applied to the first gate electrode of one of unselected memory cells. The first insulating film is formed on the semiconductor substrate to fill a region between the first gate electrodes of the memory cells adjacent to each other.

Next, embodiments are explained in detail with reference to the drawings. However, it is noted that the drawings are schematic ones and the dimension ratios shown in the drawings are different from the actual ones. Further, portions in which the dimensional relationships and/or the ratios of the dimensions are different are of course contained in the respective drawings. The following embodiments to be described are directed to a device and a method for embodying the technical concept of the present application and the technical concept is not specified according to the shape, structure or configuration of components. Various modifications can be made to the technical concept without departing from the scope thereof.

First Embodiment

FIG. 1 shows an example of the configuration of a semiconductor memory device according to a first embodiment. In the first embodiment, a NAND flash memory used as an example of the semiconductor memory device is explained.

<Whole Configuration of NAND Flash Memory>

As shown in FIG. 1, the NAND flash memory according to the present embodiment includes a memory cell array 1, column control circuit 2, row control circuit 3, source line control circuit 4, p-well control circuit 5, data input/output buffer 6, command interface 7 and state machine 8.

The memory cell array 1 includes a plurality of flash memory cells (NAND cells), a plurality of bit lines and a plurality of word lines. The flash memory cells are nonvolatile memory elements and arranged in a matrix, for example.

The column control circuit 2 is provided adjacent to the memory cell array 1. The column control circuit 2 controls the bits lines to perform the operation of erasing data of the flash memory cell, writing data to the flash memory cell, and reading data from the flash memory cell. In the column control circuit 2, a plurality of sense amplifier circuits 200 are provided.

The row control circuit (first voltage circuit) 3 is provided adjacent to the memory cell array 1. The row control circuit 3 selects one of the word lines in the memory cell array 1 and applies voltages (word line voltages) required for erasing, writing or reading to the selected/unselected word lines.

The source line control circuit 4 and p-well control circuit (second voltage circuit) 5 are arranged near the memory cell array 1. The source line control circuit 4 controls a source line in the memory cell array 1. The p-well control circuit 5 controls a p-type well on which the memory cell array 1 is formed.

The data input/output buffer 6 is connected to a host (not shown) via an external I/O line. The data input/output buffer 6 receives write data from the host, outputs read data to the host, and receives address data and command data from the host. Write data received by the data input/output buffer 6 is supplied to the column control circuit 2. Further, the data input/output buffer 6 receives read data read from the memory cell array 1 via the column control circuit 2.

Address data from the host received by the data input/output buffer 6 is supplied to the column control circuit 2 and row control circuit 3 via the command interface 7 and state machine 8 to select a flash memory cell in the memory cell array 1.

Further, command data from the host received by the data input/output buffer 6 is supplied to the command interface 7. The command interface 7 receives an external control signal from the host to determine whether data input to the data input/output buffer 6 is write data, command data or address data. Then, if the data is command data, the command interface 7 receives the command data and transfers the received data to the state machine 8 as a command signal.

The state machine 8 manages the operations of the flash memory. Then, the state machine 8 performs the read, write, and erase operations and data input/output management according to a command signal from the command interface 7.

<Configuration of Memory Cell Array 1>

Next, the configuration of the memory cell array 1 is explained in detail. FIG. 2 is a block diagram showing an example of the configuration of the memory cell array 1 described above.

Figure 3:
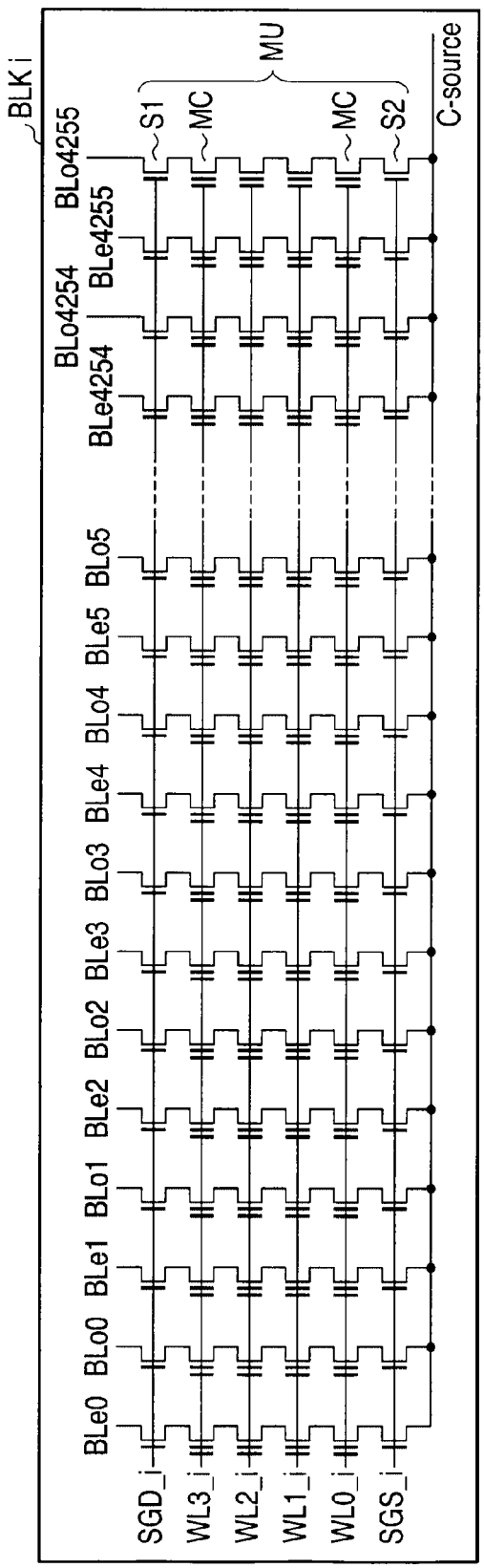
FIG. 3 is a circuit diagram showing an example of the configuration of a block in the memory cell array of FIG. 2.

As shown in FIG. 2, the memory cell array 1 includes a plurality of blocks BLK (in this example, 1024 blocks BLK0 to BLK1023 are shown, but this is one example). The block BLK is the minimum unit for erasing. In each block BLK, a plurality of (for example, 8512) NAND memory units MU are provided as shown in FIG. 3. FIG. 3 is a circuit diagram showing the internal configuration of one block BLKi (i indicates a natural number of 0 to 1023).

As shown in FIG. 3, the block BLKi includes a plurality of NAND memory units MU. Each NAND memory unit MU includes, for example, four flash memory cells MC connected in series. The number of flash memory cells in the NAND memory unit MU is not limited to four and may be adequately and selectively set to 8, 16, 32, 64 or the like. The flash memory cells MC on one-end portions in series-connection are connected to corresponding bit lines BL (BLe0 to BLe4255, BLo0 to BLo4255) via select gates S1 that are commonly connected to a select gate line SGD_i. Further, the flash memory cells MC on the other end portions in the series-connection are connected to a common source line C-source via select gates S2 that are commonly connected to a select gate line SGS_i.

Each flash memory cell MC includes a control gate and charge accumulation layer (for example, floating gate), but does not include impurity diffusion layers functioning as a source region and drain region. The control gates of the four flash memory cells MC contained in each NAND flash memory unit MU are commonly connected to corresponding word lines WL (WLo_i to WL3_i), respectively.

The data write and read operations are independently performed with respect to even-numbered bit lines BLe and odd-numbered bit lines BLo. For example, the data write and read operations are simultaneously performed with respect to 4256 flash memory cells MC connected to the even-numbered bit lines BLe among the 8512 flash memory cells MC whose controls gate are commonly connected to one word line WL. When each flash memory cell MC stores one-bit data, data of 4256 bits stored in the 4256 flash memory cells MC configures a unit of page.

Figure 4:
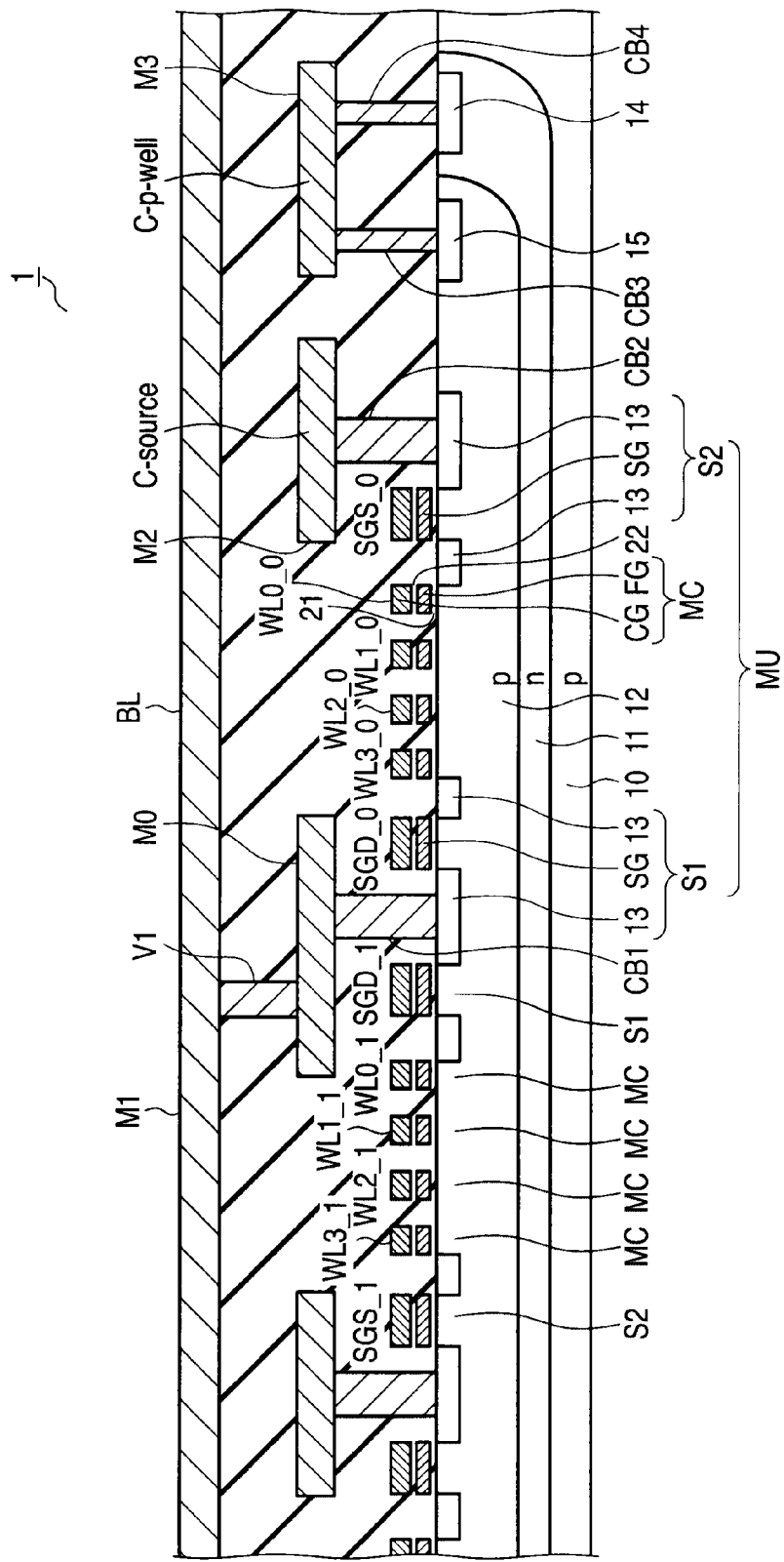
FIG. 4 is a cross-sectional view showing the structure of the memory cell array of FIG. 2 in a column direction.

FIG. 4 is a cross-sectional view showing the memory cell array 1 in a column direction (in a direction along the bit line BL). As shown in FIG. 4, for example, an n-type well 11 is formed on a p-type semiconductor substrate 10 and a p-type well (with the p-type impurity concentration of not higher than $1E15$ $cm^{-3}$) 12 that is a low-concentration region is formed in the n-type well 11. Each flash memory cell MC includes a stacked gate of a floating gate FG and a control gate CG. The floating gate FG is formed on the channel region with a tunnel oxide film 21 interposed therebetween. The channel region is a part of the surface region of the p-type well 12. The control gate CG is formed on the floating gate FG with an insulating film 22 interposed therebetween. The control gate CG functions as the word line WL.

Each select gate S1 is a MOS transistor including a source and drain formed of n-type impurity diffusion layers 13 and a gate electrode SG with a double-layered structure having polysilicon layers stacked, for example. The gate electrode SG is connected to a select gate line SGD_i. The select gate lines SGD_i and word lines WL are connected to the row control circuit 3 shown in FIG. 1 and controlled by output signals from the row control circuit 3.

Each select gate S2 is a MOS transistor including a source and drain formed of n-type impurity diffusion layers 13 and a gate electrode SG with a double-layered structure having polysilicon layers stacked, for example. The gate electrode SG is connected to a select gate line SGS_i. The select gate lines SGS_i and word lines WL are connected to the row control circuit 3 shown in FIG. 1 and controlled by output signals from the row control circuit 3.

The adjacent memory units MU share a drain of the select gate S1 or a source of the select gate S2.

One end (the drain of the select gate S1) of the NAND memory unit MU including the four flash memory cells MC and select gates S1, S2 is connected to a metal interconnection layer M0 in a first level layer via a contact electrode CB1. The metal interconnection layer M0 is connected to the bit line BL via a via electrode V1. The bit line BL is formed of a metal interconnection layer M1 in a second level layer above the first level interconnection M0. The bit line BL is connected to the column control circuit 2 shown in FIG. 1.

The other end (the source of the select gate S2) of the NAND memory unit MU is connected to a metal interconnection layer M2, in the first level layer, used as the common source line C-source via a contact electrode CB2. The common source line C-source is connected to the source line control circuit 4 shown in FIG. 1.

An n-type impurity diffusion layer 14 is formed in the surface of the n-type well 11 and a p-type impurity diffusion layer 15 is formed in the surface of the p-type well 12. The n-type impurity diffusion layer 14 and p-type impurity diffusion layer 15 are both connected to an metal interconnection layer M3, in the first level layer, used as a well line C-p-well via contact electrodes CB3, CB4, respectively. The well line C-p-well is connected to the p-well control circuit 5 shown in FIG. 1.

<Configuration of Column Control Circuit 2>

Figure 5:
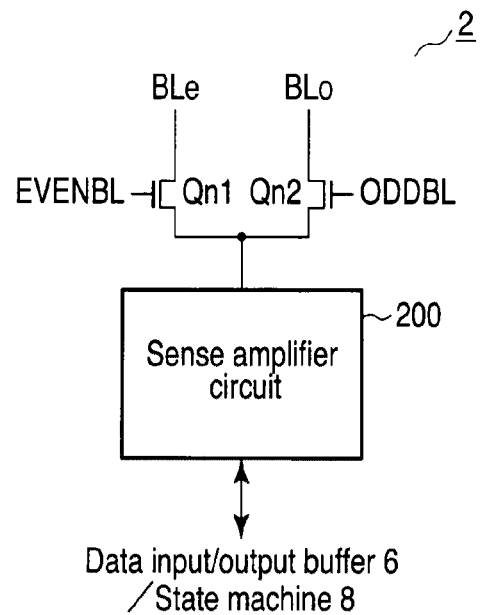
FIG. 5 is a circuit diagram showing an example of the configuration of a column control circuit in the NAND flash memory of FIG. 1.

Next, the configuration of the column control circuit 2 is explained in detail. FIG. 5 is a circuit diagram showing an example of the configuration of the column control circuit 2 described above.

As shown in FIG. 5, the column control circuit 2 includes n-channel MOS transistors Qn1, Qn2 and sense amplifier circuit 200. In the configuration according to this embodiment, the sense amplifier circuit 200 is provided for every two bit lines BL including an even-numbered bit line BLe and odd-numbered bit line BLo with the same column number.

The MOS transistor Qn1 is connected between the sense amplifier circuit 200 and the even-numbered bit line BLe. Further, the MOS transistor Qn2 is connected between the sense amplifier circuit 200 and the odd-numbered bit line BLo. For example, a signal EVENBL is supplied to the gate of the n-channel MOS transistor Qn1 and a signal ODDBL is supplied to the gate of the n-channel MOS transistor Qn2 from the state machine 8.

One of the even-numbered and odd-numbered bit lines BLe, BLo is selected by the n-channel MOS transistors Qn1, Qn2 and connected to a corresponding one of the sense amplifier circuits 200 and the operation for controlling the data write and data read operations is performed. That is, when the signal EVENBL is set at a high level (H) and the signal ODDBL is set at a low level (L), the n-channel MOS transistor Qn1 is made conductive to select the even-numbered bit line BLe and thus the bit line BLe is connected to the sense amplifier circuit 200. When the signal EVENBL is set at the L level and the signal ODDBL is set at the H level, the n-channel MOS transistor Qn2 is made conductive to select the odd-numbered bit line BLo and thus the bit line BLo is connected to the sense amplifier circuit 200. In this case, the signal EVENBL is commonly supplied to all of the n-channel MOS transistors Qn1 that are connected to the even-numbered bit lines BLe and the signal ODDBL is commonly supplied to all of the n-channel MOS transistors Qn2 that are connected to the odd-numbered bit lines BLo. The unselected bit lines BL (BLe, BLo) are controlled by another circuit that is not shown in the drawing.

<Structure of Flash Memory Cell MC>

Figure 7:
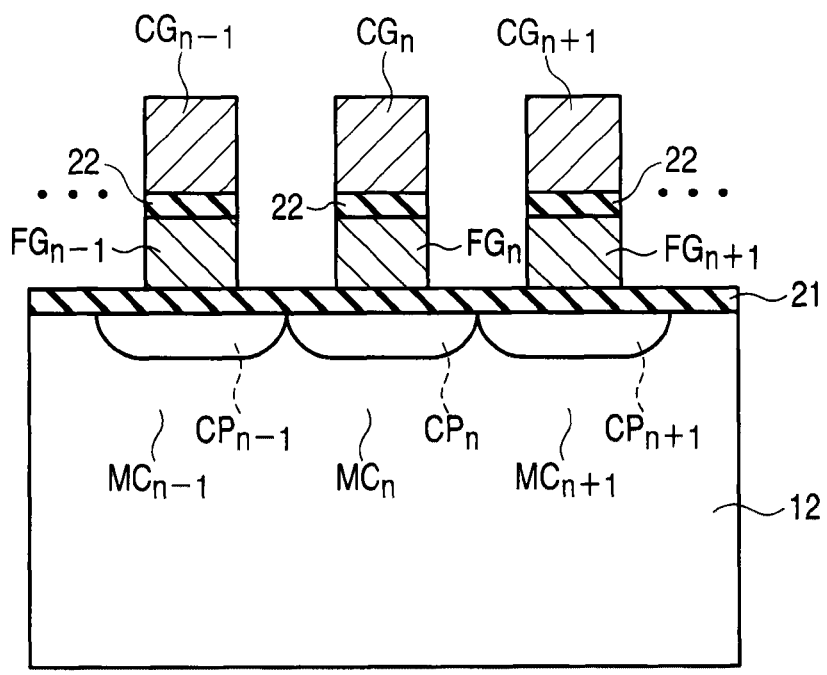
FIG. 7 is a cross-sectional view showing an example of formation of inversion layers in the flash memory cells of FIG. 6.
Figure 6:
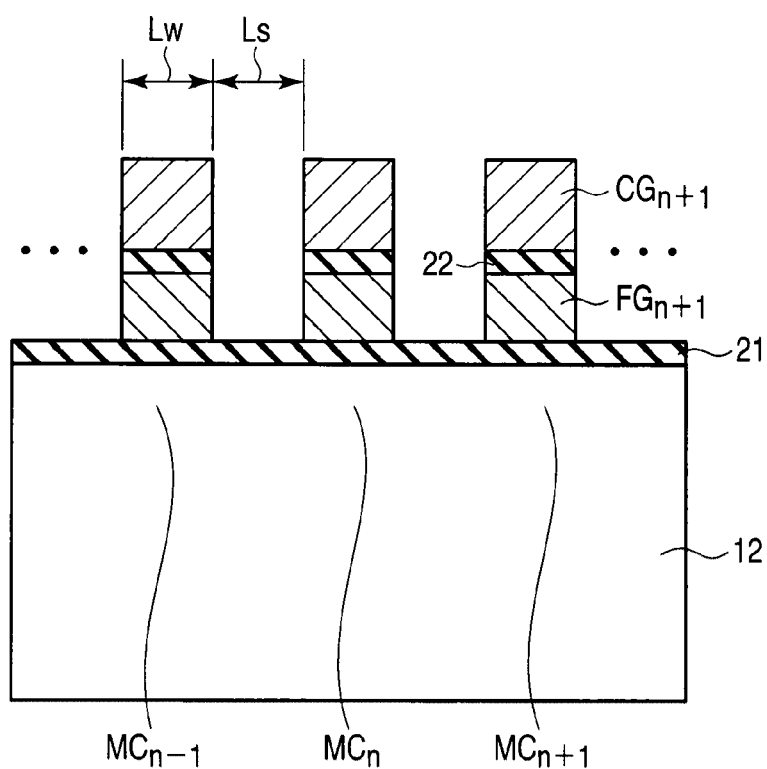
FIG. 6 is a cross-sectional view showing an example of the structure of flash memory cells according to the first embodiment.

Next, the structure of the flash memory cell MC is explained in detail. FIGS. 6 and 7 are cross-sectional views of flash memory cells MC and show flash memory cells MCn−1, MCn, MCn+1 in one NAND memory unit MU as an example. In this case, FIG. 6 shows the basic element structures of the flash memory cells MC and FIG. 7 shows a state in which inversion layers (channels, depletion layers) are formed in the structure of FIG. 6.

In this embodiment, the p-type impurity concentration is low, for example, the boron concentration is not higher than $1E15$ cm$^{-3}$ at least in the surface portion of the p-type well (low-concentration impurity region) 12. However, the impurity concentration is equal to or higher than the impurity concentration (for example, approximately $4E14$ cm$^{-3}$) of a raw wafer in which p-type impurities are not implanted. The concentration is kept uniform in the surface portion thereof. Thus, a variation in the threshold voltage (Vth) of the flash memory cell MC due to fluctuation in the impurities caused by miniaturization can be alleviated.

Further, the gate electrode width Lw of the floating gate FG and control gate CG (stacked gate) of each flash memory cell MC and the distance Ls between the adjacent stacked gates are both set to 22 nm, for example. Of course, Lw and Ls are not limited to 22 nm and Lw may be different from Ls.

Therefore, for example, as shown in FIG. 7, inversion layers CPn−1, CPn, CPn+1 caused by floating gates FGn−1, FGn, FGn+1 of adjacent flash memory cells MCn−1, MCn, MCn+1 can be connected to one another in the surface portion (channel region) of the p-type well 12 even if the source regions and drain regions that are conventionally arranged between the respective gate electrodes are not formed. Formation of the inversion layers CPn−1, CPn, CPn+1 formed according to the presence or absence of electrons (data) in the floating gates FGn−1, FGn, FGn+1 is controlled by gate voltages (word line voltages) applied to the control gates CGn−1, CGn, CGn+1 and/or a voltage (Vsub) of the p-type well 12 applied to the P-well control circuit 5, for example. That is, formation of the inversion layers CPn−1, CPn, CPn+1 depends on the electron concentration distributions (SDS, SDD) of regions corresponding to the source and drain regions in the conventional case as will be described later.

Figure 8:
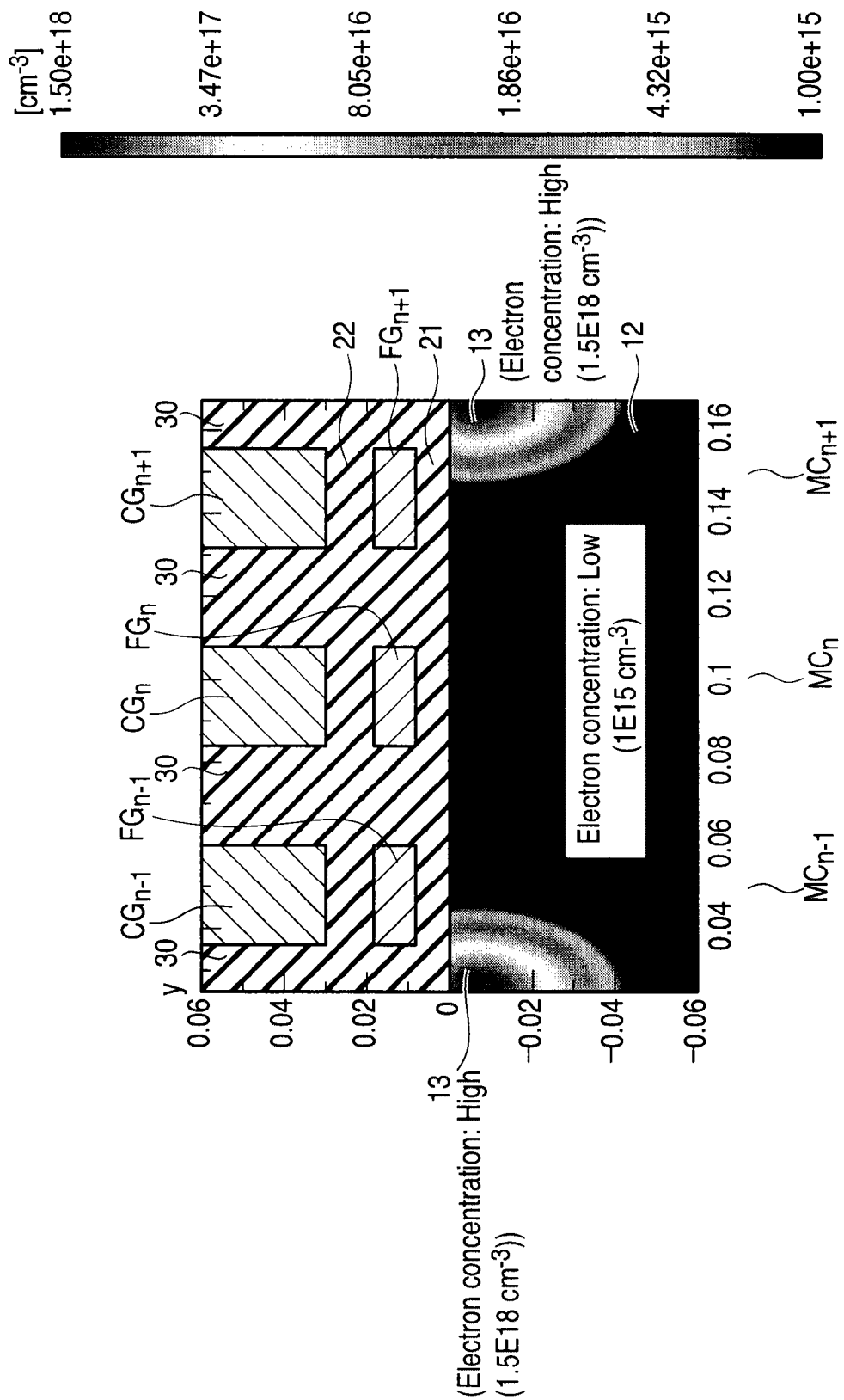
FIG. 8 is a cross-sectional view showing electron concentration distribution in source and drain regions in the flash memory cells of FIG. 6.

FIG. 8 shows a simulation result of the electron concentration distribution in the p-type well 12 in the structure of FIG. 6. In FIG. 8, a case wherein inversion layers (channels) are not formed in the flash memory cells MCn−1, MCn, MCn+1 and select gates S1, S2 are respectively provided adjacent to the flash memory cells MCn−1, MCn+1 is shown. In this case, an insulating film 30 (for example, silicon oxide film) is filled in spaces between the adjacent stacked gates.

As shown in FIG. 8, regions with high electron concentration (that is, conventional source and drain regions) are not formed in a region between the flash memory cells MCn and MCn+1 and a region between the flash memory cells MCn and MCn−1 in the p-type well 12. In other words, a region between the flash memory cells MCn−1 and MCn+1 in the surface area of the p-type well 12 is formed as a p-type region with uniform electron concentration (for example, 1E15 cm$^{-3}$).

On the other hand, a region with high electron concentration (for example, the maximum electron concentration of the region is 1.5E18 cm$^{-3}$) is formed between the flash memory cell MCn+1 and the select gate S1. The above region functions as a source region 13 of the select gate S1. Further, a region with high electron concentration is formed between the flash memory cell MCn−1 and the select gate S2. The above region functions as a drain region 13 of the select gate S2.

With the above structure, as shown in FIG. 7, the inversion layers (channels) CPn−1, CPn, CPn+1 are formed in the flash memory cells MCn−1, MCn, MCn+1 according to the charge densities of the floating gates FGn−1, FGn, FGn+1. Every adjacent ones of the inversion layers CPn−1, CPn, CPn+1 are formed in contact with each other. That is, the inversion layers CPn−1, CPn, CPn+1 function not only as the channels of the flash memory cells MCn−1, MCn, MCn+1 but also as the source and drain regions thereof.

<Program Operation of NAND Flash Memory>

Next, the program operation of the NAND flash memory according to this embodiment is explained below. The data write operation to the flash memory cells MC is performed for each page unit. In the following description, data held by the flash memory cell MC set in the erase state is referred to as "1" data. The threshold voltage of the flash memory cell MC that holds "1" data is set at a negative value, for example. Further, data held by the flash memory cell MC in which electrons are injected into the floating gate FG and whose threshold voltage is set to a positive value is referred to as "0" data.

First, the row control circuit 3 supplies a write pulse of high voltage (write voltage Vpgm) to a word line WL (control gate CG) connected to a memory cell MC (that is referred to as a selected flash memory cell MC) to be programmed. Potentials of the other unselected word lines WL are set to VPASS. VPASS is a voltage that sets the flash memory cell MC in a turn-on state (forms a channel) irrespective of data held by the flash memory cell and is a voltage lower than Vpgm.

As a result, channels are formed in all of the flash memory cells MC in the NAND memory unit MU including the selected flash memory cell MC. That is, inversion layers are formed in the surface area of the p-type well 12 in the NAND memory unit MU. Every adjacent memory cells MC are connected via the channels and all of the flash memory cells MC in the NAND memory unit MU are set into a conductive state.

Then, the column control circuit 2 biases the potential level of a bit line BL connected to the selected flash memory cell MC into which "0" data is to be written to voltage VSS and the row control circuit 3 turns on the select gate S1 (SGD_0=Vsg, SGS_0=0 V).

As a result, the potential of the inversion layer formed in the surface area of the p-type well 12 is set to voltage VSS (0 V). In the selected flash memory cell MC, a high electric field is applied between the floating gate FG and the surface region of the p-type well 12. Therefore, electrons are injected from the surface region of the p-type well 12 to the floating gate FG. Thus, the threshold voltage of the selected flash memory cell MC is raised. That is, "0" data is written.

Further, the column control circuit 2 biases the potential level of a bit line BL connected to the selected memory cell MC into which "0" data is not written to voltage VDD (>VSS). Then, the row control circuit 3 cuts off the select gate S1 (SGD_0=0 V, SGS_0=0 V).

Then, in the NAND memory unit MU including the selected flash memory cell MC, the inversion layer (the surface region of the p-type well 12) is made to electrically float. The potential of the inversion layer increases to certain potential Vinhibit by coupling with the control gate CG. Therefore, no high electric field is applied between the floating gate FG and the surface region of the p-type well 12. As a result, no electrons are injected to the selected flash memory cell MC and a state in which "1" data is held is maintained.

Generally, in the program operation in the NAND flash memory, a write pulse is supplied to a selected word line WL by the row decoder to write data to the selected flash memory cell MC and then a verify pulse is supplied to the selected word line WL to perform a verify operation. The write operation and verify operation are repeatedly performed until the threshold voltage of the selected flash memory cell MC reaches a desired value.

<Read Operation of NAND Flash Memory>

Next, the read operation of the NAND flash memory according to this embodiment is explained below by, for example, taking a case wherein data is read from a selected flash memory cell MCn as an example.

The row control circuit 3 applies first read voltage Vcg1 to control gates CGn−1, CGn+1 of all of unselected flash memory cells MCn−1, MCn+1, that is, word lines WLn−1, WLn+1. First read voltage Vcg1 is a voltage that turns on the flash memory cell MC irrespective of data held. As a result, the flash memory cells MCn−1, MCn+1 are turned on and inversion layers CPn−1, CPn+1 are formed.

Further, the row control circuit 3 applies second read voltage Vcg2 to a control gate CGn of the selected flash memory cell MCn, that is, a word line WLn. Second read voltage Vcg2 is a voltage lower than first read voltage Vcg1 and set to a value corresponding to a read level.

If desired data is stored in the selected flash memory cell MCn, the selected flash memory cell MCn is turned on. That is, in the selected flash memory cell MCn, an inversion layer CPn is formed in the surface of the p-type well 12. The inversion layer CPn is formed in contact with the inversion layers CPn−1, CPn+1 and, as a result, the inversion layers form a current path (continuous channel regions). Therefore, current flows from the bit line BL to the source line SL.

On the other hand, if desired data is not stored in the selected flash memory cell MCn, the selected flash memory cell MCn is turned off. That is, in the selected flash memory cell MCn, no inversion layer CPn is formed. As a result, a current path that is continuous from the bit line BL to the source line SL is not formed in the NAND memory unit MU. Therefore, no current flows from the bit line BL to the source line SL.

As described above, data of the selected flash memory cell MCn is read by determining formation of a current path, that is, by sensing cell current that flows according to formation of a current path by the sense amplifier circuit 200 and thus whether data is "0" or "1" can be determined.

<Effect>

As described above, in the NAND flash memory according to the first embodiment, the reliability of the operation of the NAND flash memory can be enhanced while the size of the flash memory cell is reduced.

That is, in the structure according to this embodiment, the flash memory cell in which data can be rewritten can be formed without forming the source and drain regions between the stacked gates.

More specifically, impurities are implanted into the p-type well (substrate) of the flash memory so that the impurity concentration thereof will not become higher than 1E15 cm$^{-3}$. When the flash memory cells are miniaturized or when the distance between adjacent stacked gates is reduced, inversion layers are formed by the floating gates of the adjacent flash memory cells and the inversion layers (channel regions) are connected to each other.

As a result, the function of the flash memory cell can be attained even if the source and drain regions are not formed. Therefore, when the flash memory cells are miniaturized, a variation in the threshold voltage due to fluctuation in the impurities of the miniaturized flash memory cell can be suppressed without causing a problem that the source and drain regions are connected to each other.

Further, the insulating film is filled in the space area between the stacked gates of the adjacent flash memory cells and no conductive layer is required in the above area. This also reduces the size of the memory cell array 1.

Second Embodiment

Next, a semiconductor memory device according to a second embodiment is explained. In this embodiment, the p-type well 12 in the first embodiment is formed to include a low-concentration region in the surface side and a high-concentration region in the deep side. In the following description, only portions different from those of the first embodiment are explained.

FIG. 9A is a cross-sectional view of a flash memory cell MC according to the second embodiment and shows the distribution of p-type impurity concentration (for example, boron concentration) in the p-type well 12. FIG. 9B shows the relation (Id-Vcg2 characteristic) between gate voltage Vcg2 and drain current Idrain of the flash memory cell according to the second embodiment. Further, the same portions as those of the first embodiment are denoted by the same reference symbols and the detailed explanation thereof is omitted.

As shown in FIG. 9A, in the structure according to this embodiment, the p-type well 12 includes a low-concentration region 12a and high-concentration region 12b. In the low-concentration region 12a, for example, boron concentration is set not higher than $1E15$ cm$^{-3}$ and is set equal to or higher than the impurity concentration (for example, approximately $4E14$ cm$^{-3}$) of a raw wafer in which, for example, p-type impurities are not implanted. The p-type impurity concentration (for example, boron concentration) of the high-concentration region 12b is higher than that of the low-concentration region 12a and the concentration thereof is set to approximately $1E18$ cm$^{-3}$, for example.

The low-concentration region 12a is formed in the surface area of the p-type well 12, the high-concentration region 12b is formed under the low-concentration region 12a and the regions contact with each other. The thickness of the low-concentration region 12a (the depth from the surface of the p-type well 12 that is an interface with a tunnel oxide film 21) is set to 20 nm or less, for example.

Ideally, it is desirable to form the low-concentration region 12a to the same depth as that of a depletion layer formed by the flash memory cell MC. In other words, it is desirable to set the depth of the low-concentration region 12a so as to contact the lower end portion of the depletion layer with the high-concentration region 12b.

<Effect>

As described above, in the NAND flash memory according to this embodiment, for example, it becomes possible to more stably cut off a selected flash memory cell MCn by forming the high-concentration region 12b under the low-concentration region 12a as shown in FIG. 9A. That is, if first read voltage Vcg1 applied to control gates CGn−1, CGn+1 of flash memory cells MCn−1, MCn+1 that are adjacent to the selected flash memory cell MCn is set to 6 V, for example, it becomes possible to cut off the selected flash memory cell MCn without fail by setting second read voltage Vcg2 applied to the control gate CGn to approximately 6 V, for example (see FIG. 9B).

This is because the depletion layer is difficult to extend in the high-concentration region 12b than in the low-concentration region 12a. That is, this is because inversion layers CPn−1, CPn+1 can be suppressed from being connected to each other via a deep region of the p-type well 12.

Figures 10A, 10B:
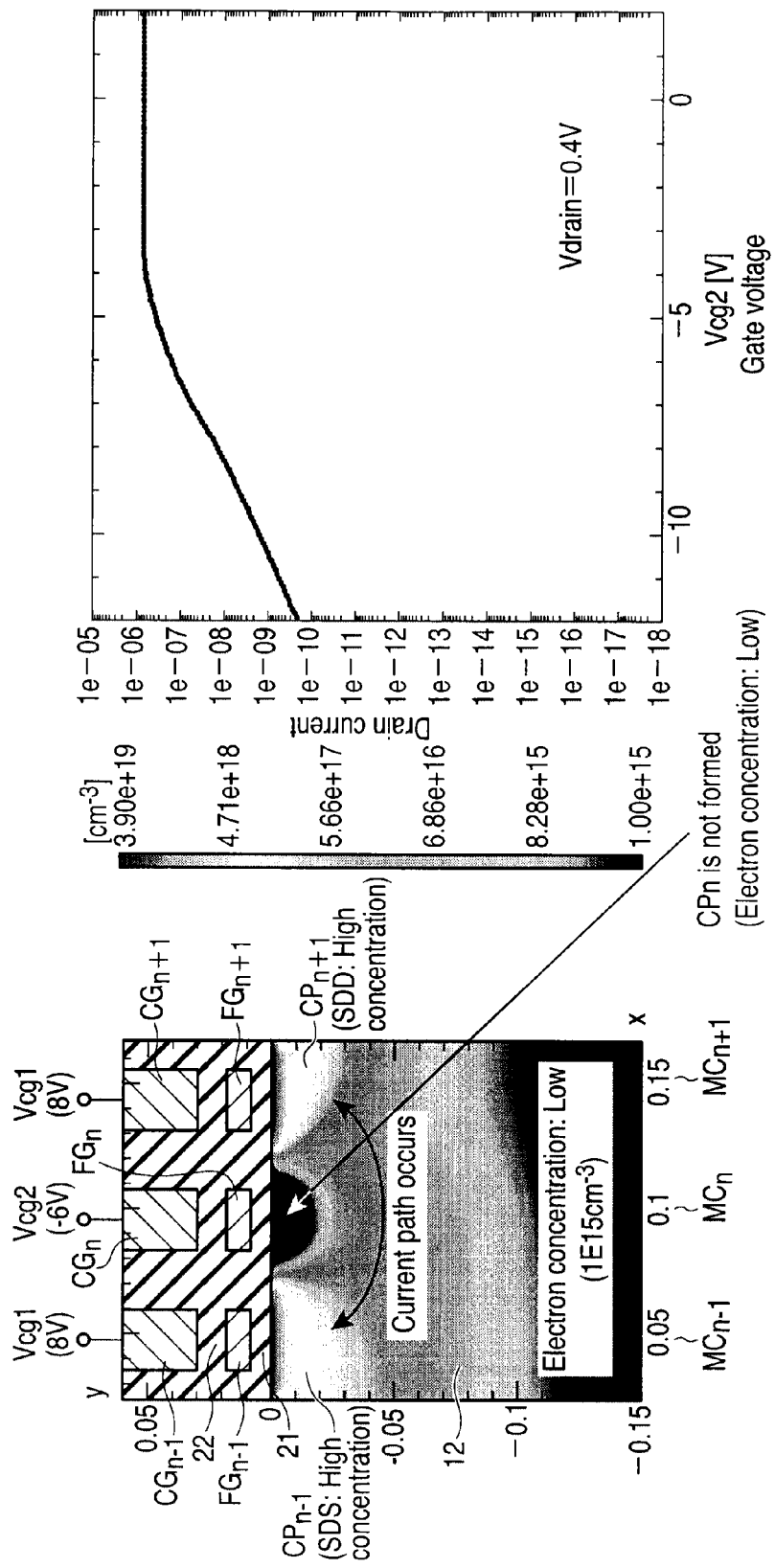
FIG. 10A is a cross-sectional view of flash memory cells.
FIG. 10B is a graph showing an IV characteristic of a flash memory cell.

FIG. 10A is a cross-sectional view of the flash memory cell and shows a simulation result of electron concentration distribution in the p-type well 12 when the p-type well 12 is formed without forming the high-concentration region 12b. The simulation condition of FIG. 10A is that Vcg1=8 V and Vcg2=−6 V. FIG. 10B shows the relation (Id-Vcg2 characteristic) between gate voltage Vcg2 and drain current Idrain.

As shown in FIG. 10A, since the flash memory cell MC is turned off, no channel is formed. Therefore, in a region directly below the stacked gate of the flash memory cell MCn, electron concentration is sufficiently low. However, a depletion layer formed by the flash memory cell MCn−1 and a depletion layer formed by the flash memory cell MCn+1 are connected to each other in a deep region of the p-type well 12. That is, a current path is formed. Therefore, as shown in FIG. 10A, there occurs a possibility that a large drain current will flow even if voltage Vcg2 is set sufficiently low. In other words, the flash memory cell MCn cannot be cut off.

In this respect, with the structure according to this embodiment, it is possible to prevent occurrence of an operation problem that the selected flash memory cell MCn cannot be cut off even when second read voltage Vcg2 applied to the control gate CGn of the selected flash memory cell MCn is set to approximately −6 V depending on first read voltage Vcg1 (8 V in the example of FIG. 10A) applied to the control gates CGn−1, CGn+1 of the adjacent flash memory cells MCn−1, MCn+1.

As described above, according to the structure of this embodiment, inversion layers CPn−1, CPn+1 formed by the floating gates FGn−1, FGn+1 of the flash memory cells MCn−1, MCn+1 can be prevented from being connected to each other in the deep portion of the p-type well 12 by forming the high-concentration region 12b. As a result, the flash memory cell MCn can be stably cut off and the operation performance (particularly, the precision of the read operation) can be enhanced in addition to the effect explained in the first embodiment.

Third Embodiment

Next, a semiconductor memory device according to a third embodiment is explained. In this embodiment, the structure explained in the first embodiment is applied to an SOI (Silicon On Insulator) substrate. In the following description, only portions different from those of the first embodiment are explained.

FIG. 11 is a cross-sectional view showing an example of flash memory cells MC according to this embodiment. In this example, a case wherein inversion layers CPn−1, CPn+1 formed by floating gates FGn−1, FGn+1 of flash memory cells MCn−1, MCn+1 are prevented from being connected to each other by an insulating layer is explained. The same portions as those of the first embodiment are denoted by the same reference symbols and the detailed explanation thereof is omitted.

As shown in FIG. 11, in the structures of FIGS. 6 and 8 explained in the first embodiment, an insulating layer 23 is formed in a p-type well 12. The insulating layer 23 is formed of a material of a silicon oxide film, for example. The flash memory cells MC are formed on the p-type well 12 on the insulating layer 23. The thickness (the depth from the surface portion (the interface with the gate oxide film 21)) of the p-type well 12 on the insulating layer 23 is set to approximately 20 nm or less, for example.

Ideally, it is preferable that the insulating film 23 be formed below a depletion layer formed by the flash memory cell MC. Alternatively, it is preferable to form the insulating layer in contact with the lower end portion of the depletion layer.

<Effect>

In the structure according to this embodiment, occurrence of punch-through can be suppressed by the insulating layer 23. Therefore, the same effect as that of the second embodiment can be attained. That is, the selected flash memory cell MCn can be cut off without fail and the operation performance (particularly, the precision of the read operation) can be enhanced.

Fourth Embodiment

Next, a semiconductor memory device according to a fourth embodiment is explained. In this embodiment, a flash memory cell MC is cut off by applying substrate voltage Vsub (≠0) to the p-type well 12 by the p-well control circuit 5 in the structure explained in the first embodiment. In the following description, only portions different from those of the first embodiment are explained.

FIGS. 12A, 12B and 12C are cross-sectional views showing flash memory cells MC according to this embodiment and particularly shows a simulation result showing variations in the electron concentration distribution in the p-type well 12 by application of voltage Vcg2. In this case, Vcg1 is 4 V and is set constant. The structure of the flash memory cell MC is the same as the structure explained in the first embodiment (the respective elements are denoted by the same reference symbols as those of the first embodiment).

As shown in FIGS. 12A, 12B and 12C, the p-well control circuit 5 applies, for example, a negative voltage of, for example, −5 V as substrate voltage Vsub to the p-type well 12 at the data read time. Further, when 4 V is applied as first read voltage Vcg1 to control gates CGn−1, CGn+1 of flash memory cells MCn−1, MCn+1 that are adjacent to a flash memory cell MCn, the electron concentration distribution in the surface portion (channel region) of the p-type well 12 is varied according to second read voltage Vcg2 applied to the control gate CGn of the selected flash memory cell MCn.

Figure 13:
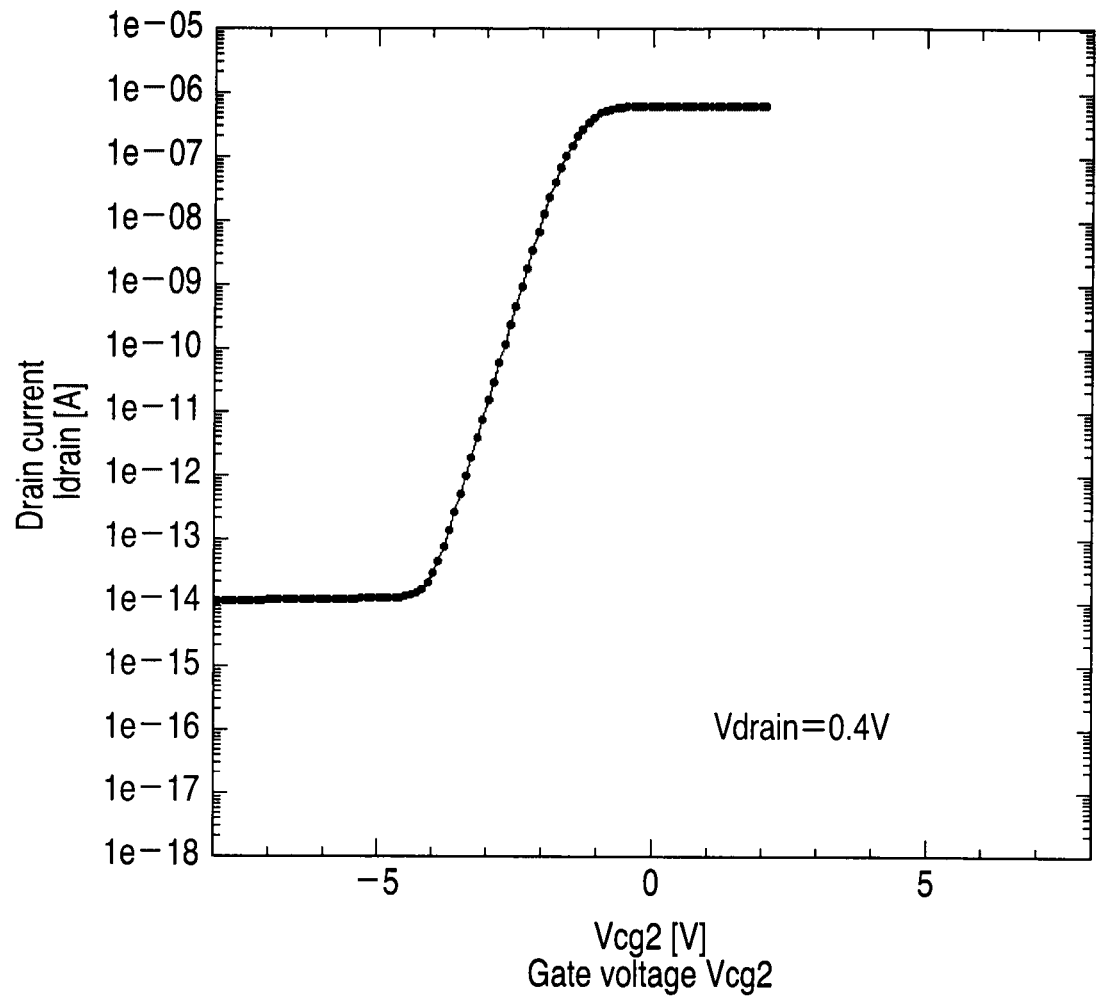
FIG. 13 is a diagram for illustrating the characteristic of the flash memory cell of FIG. 12.

That is, in a case where first read voltage Vcg1 is set to 4 V in a NAND flash memory in which a negative voltage of −5 V is applied as substrate voltage Vsub to the p-type well 12, the selected flash memory cell MCn can be sufficiently cut off as shown in FIG. 13, for example, by setting second read voltage Vcg2 to −4 V. FIG. 13 is a graph for illustrating the relation (Id-Vcg2 characteristic) between gate voltage Vcg2 and drain current Idrain.

A current path that connects inversion layers CPn−1, CPn+1 can be formed in the surface portion of the p-type well 12 that corresponds to the selected flash memory cell MCn by setting second read voltage Vcg2 to approximately −2 V. Therefore, variations in the threshold voltages of the miniaturized flash memory cells due to fluctuation in the impurities can be suppressed without causing a problem that the source region and drain region are short-circuited and the operation performance (particularly, the precision of the read operation) can be enhanced.

<Effect>

As described above, in the structure according to this embodiment, the flash memory cell MC can be cut off without forming a high-concentration region or an insulating layer in the p-type well 12 by applying a potential to the p-type well 12. Of course, this embodiment can be combined with the second and third embodiments. That is, in the second and third embodiments, substrate potential Vsub may be applied to the low-concentration region 12a or the well region 12 on the insulating layer 31. An operation performed at the data read time is explained as an example in FIGS. 12A to 12C, but the same operation is also performed at the write time. At the write time, Vpgm is applied to a selected word line, VPASS is applied to unselected word lines, and a predetermined voltage (for example, negative voltage) is applied to the p-type well 12. This is true in the following embodiments.

Fifth Embodiment

Next, a semiconductor memory device according to a fifth embodiment is explained. In this embodiment, the n-type impurity diffusion layers between the select gates S1, S2 and the respective flash memory cells MC in the first embodiment are eliminated and high-dielectric-constant layers are provided between the stacked gates of the flash memory cells MC and the select gates S1, S2. The other structure is the same as that of the first embodiment, and therefore, the explanation is made in the following description with much attention particularly paid to portions different from those of the first embodiment.

Figure 14:
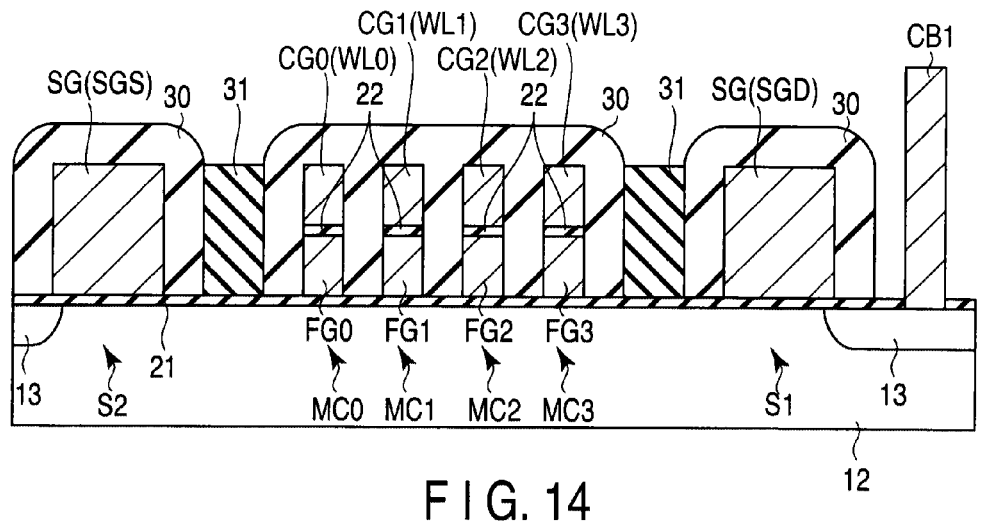
FIGS. 14 to 16 are cross-sectional views showing a NAND memory unit according to a fifth embodiment.

FIG. 14 is a cross-sectional view showing a NAND memory unit MU according to this embodiment. As shown in FIG. 14, flash memory cells MC0 to MC3 are sequentially arranged between select gates S2 and S1. Like the first embodiment, the flash memory cell MC does not include n-type impurity diffusion layers functioning as source and drain regions. Further, in this embodiment, n-type impurity diffusion layers 13 functioning as a source region of the select gate S1 and a drain region of the select gate S2 are eliminated.

Like the first embodiment, the peripheral portions of the stacked gates of the flash memory cells MC0 to MC3 are surrounded by an insulating film 30 and region between the stacked gates of every adjacent flash memory cells MC are completely filled with the insulating film 30. Further, the peripheral portions of the gate electrodes of the select gates S1, S2 are also surrounded by respective insulating films 30. The insulating film 30 is a silicon oxide film, for example.

A high-dielectric-constant layer 31 is formed in a region between the stacked gate of the flash memory cell MC3 and the gate electrode of the select gate S1. The high-dielectric-constant layer 31 is formed of a material with a dielectric constant higher than that of a silicon nitride film (SiN), for example, and is formed of $HfO_2$ or alumina ($Al_2O_3$), for example. Likewise, a high-dielectric-constant layer 31 is also formed in a region between the stacked gate of the flash memory cell MC0 and the gate electrode of the select gate S2. That is, the region between the select gates S1, S2 and the respective adjacent flash memory cells MC are completely filled with the insulating films 30 and high-dielectric-constant layers 31. Instead of the high-dielectric-constant layer 31, a material with a dielectric constant higher than that of a silicon oxide film, for example, a silicon nitride film may be formed.

Then, an inter-level insulating film (for example, a silicon oxide film) that is not shown in FIG. 14 is formed on the semiconductor substrate to cover the above structure.

Figure 15:
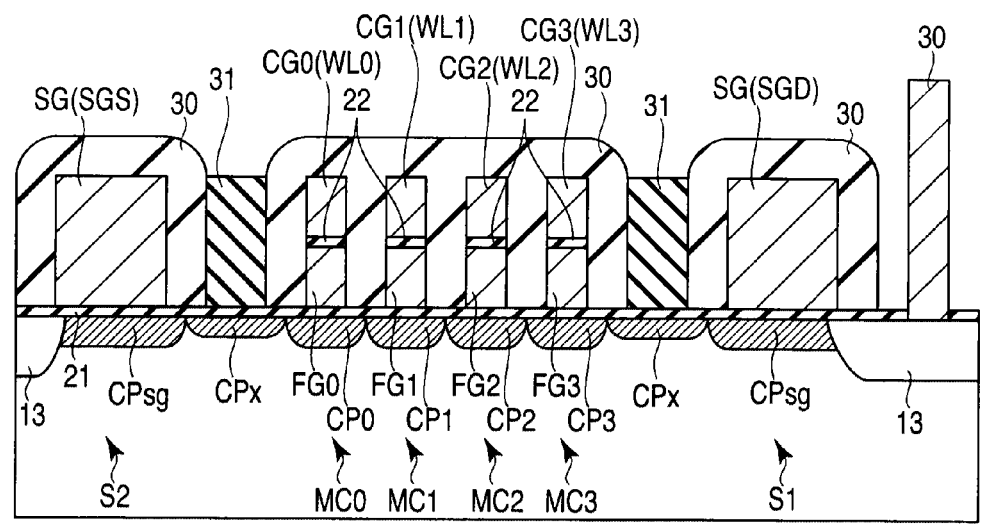

In the above structure, the state set when voltages are applied to the select gate lines SGD, SGS and word lines WL0 to WL3 to make the NAND memory unit MU conductive is shown in FIG. 15. FIG. 15 is a cross-sectional view of the NAND memory unit MU and corresponds to the area explained in FIG. 14.

As shown in FIG. 15, inversion layers CP0 to CP3 are respectively formed in the flash memory cells MC0 to MC3 and adjacent ones of them contact with each other. Further, inversion layers CPsg are formed in the select gates S1, S2. The layers are the same as those of the first embodiment.

Further, in this embodiment, inversion layers CPx are formed in regions below the high-dielectric-constant layers 31 in the p-type well 12 by the high-dielectric-constant layers 31. The inversion layers CP3 and CPsg are connected via the inversion layer CPx and the inversion layers CP0 and CPsg are also connected via the inversion layer CPx. As a result, the NAND memory unit MU is made conductive.

The other structure and operation are the same as those explained in the first embodiment.

<Effect>

As described above, in the structure according to the fifth embodiment, the n-type impurity diffusion layers between the select gates S1, S2 and the respective flash memory cells MC are eliminated and the NAND flash memory unit MU can be made conductive. The effect is explained below.

In the NAND flash memory unit MU, generally, the distance between the word line WL and the select gate line SGD or SGS adjacent thereto is larger than the distance between the adjacent word lines WL. This is caused by a requirement of photolithography process. Specifically, the distance between the word line WL and the select gate line SGD or SGS adjacent thereto is approximately 50 nm, for example.

Therefore, it is necessary to form n-type impurity diffusion layers between the select gates S1, S2 and the flash memory cells MC adjacent thereto to connect them. If the impurity diffusion layers are eliminated, inversion layers in the flash memory cell MC and the select gate S1 or S2 cannot contact with each other since the distance therebetween is large. Therefore, there occurs a possibility that the region between the flash memory cell MC and the select gate S1 or S2 becomes a high-resistance region and the NAND flash memory unit MU cannot be made conductive.

In the structure according to this embodiment, the layers (high-dielectric-constant layers 31) formed of a material with a dielectric constant higher than that of a silicon oxide film are formed between the select gates S1, S2 and the respective adjacent flash memory cells MC. A potential of the layer 31 is raised by coupling with the gate electrodes of the adjacent select gates S1, S2 and the stacked gates of the adjacent flash memory cells MC at the data write time and read time. As a result, inversion layers CPx are formed on the surface of the p-type well 12 by the layers 31. Thus, an electrical connection can be made between the select gates S1, S2 and the flash memory cells MC and the NAND flash memory unit MU can be made conductive.

<Modification>

Figure 16:
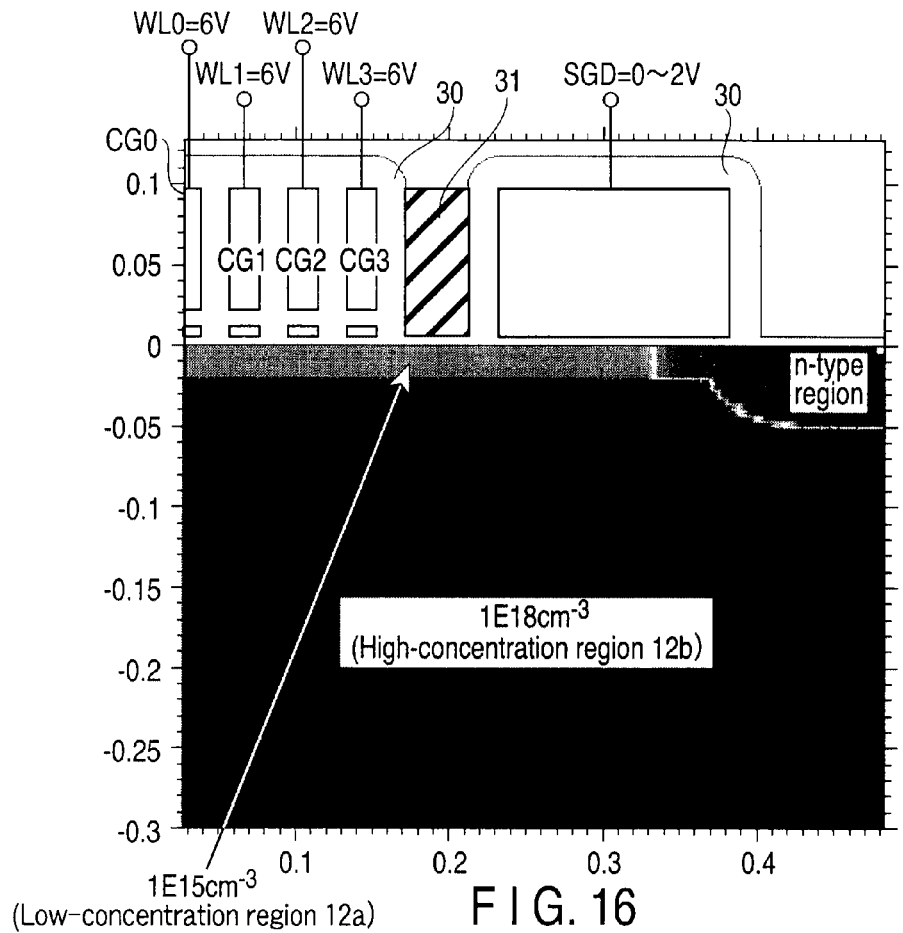

This embodiment can be applied to the second to fourth embodiments. FIG. 16 is a cross-sectional view showing a NAND memory unit MU when this embodiment is applied to the second embodiment and particularly shows a simulation result of p-type impurity concentration distribution in the p-type well 12.

As shown in FIG. 16, the p-type well 12 has a p-type impurity concentration of 1E18 cm$^{-3}$ in the high-concentration region 12b and a p-type impurity concentration of 1E15 cm$^{-3}$ in the low-concentration region 12a. In this case, n-type impurity diffusion layers are eliminated from regions between the select gates S1, S2 and flash memory cells MC adjacent thereto.

Figure 17:
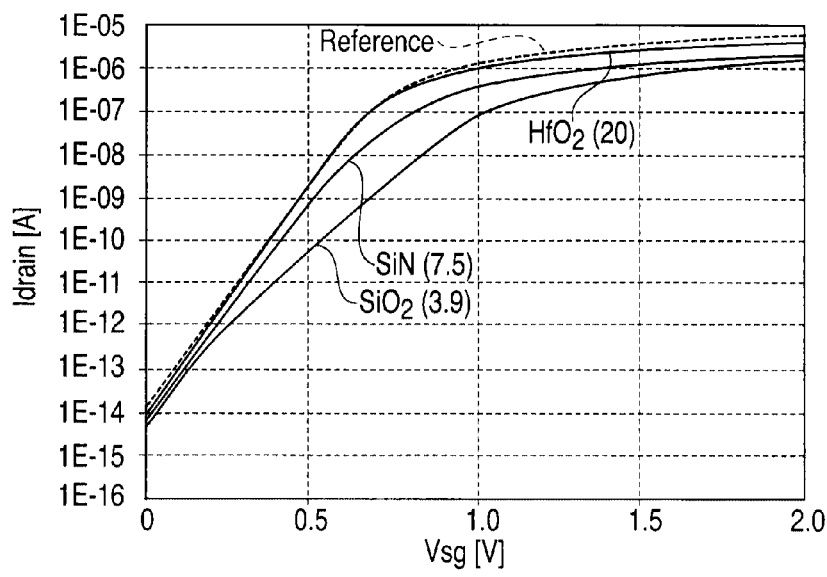
FIG. 17 is a graph showing IV characteristics of the NAND memory unit according to the fifth embodiment.

The current-voltage (IV) characteristic of the NAND memory unit MU with the above structure is shown in FIG. 17. FIG. 17 is a graph showing simulation of current Idrain (current flowing from the bit line BL to the source line C-source) flowing into the select gate S1 when Vcg2=6 V is applied to the selected word line WL, Vcg1=6 V is applied to the unselected word lines WL, 0.7 V is applied to the bit line BL, and voltage Vsg of the select gate line SGD is changed between 0 and 2 V. The distance between the select gate line SGD and the word line WL3 adjacent thereto is set to 80 nm. In FIG. 17, a case where n-type impurity diffusion layers are formed by use of As like the case of the first embodiment (Reference), a case where HfO$_2$ layers are formed as the high-dielectric-constant layers 31, a case where SiN layers are formed instead of the high-dielectric-constant layers 31 and a case where SiO$_2$ layers are formed instead of the high-dielectric-constant layers 31 are shown.

As shown in FIG. 17, if SiO$_2$ layers (dielectric constant ∈=3.9) are formed, the p-type well 12 becomes a high-resistance region and the drain current is reduced. On the other hand, if HfO$_2$ layers (dielectric constant ∈=20) are formed, substantially the same characteristic as that in a case where n-type impurity diffusion layers are formed can be obtained. Further, if SiN (∈=7.5) is used, a characteristic that is better than that in a case where SiO$_2$ is used can be obtained.

As described above, it is more preferable to use a material for filling region between the select gates S1, S2 and the flash memory cells MC as the dielectric constant thereof is larger. This is true in the structure explained in FIGS. 14 and 15.

Further, in this embodiment, an SOI substrate may be used as in the third embodiment, substrate potential Vsub may be applied as in the fourth embodiment or the above techniques may be adequately combined.

Sixth Embodiment

Next, a semiconductor memory device according to a sixth embodiment is explained. In this embodiment, dummy word lines are provided in the structure of the first embodiment and the n-type impurity diffusion layers between the select gates S1, S2 and the flash memory cells MC are eliminated like the case of the fifth embodiment. Since the other structure is the same as that of the first embodiment, only portions different from those of the first embodiment are explained in the following description.

Figure 18:
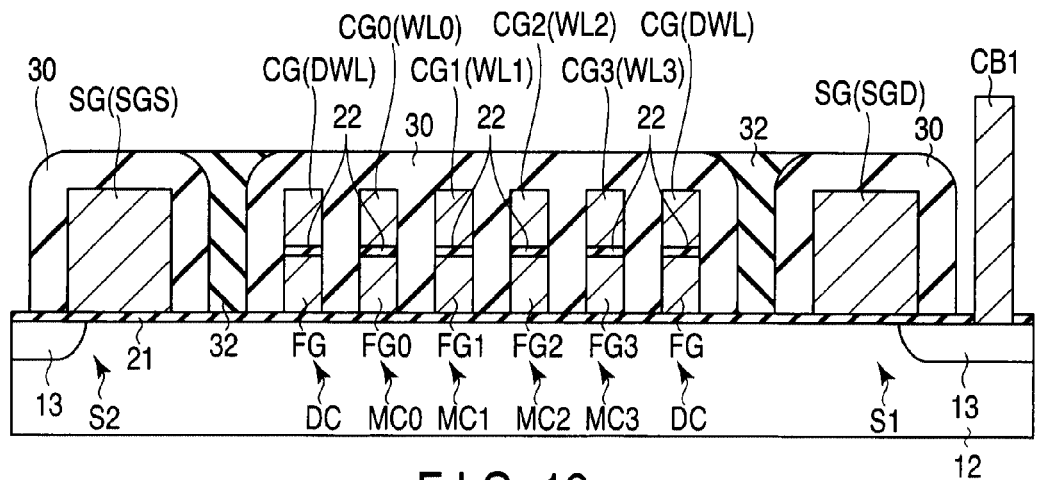
FIGS. 18 to 20 are cross-sectional views showing a NAND memory unit according to a sixth embodiment.

FIG. 18 is a cross-sectional view showing a NAND memory unit MU according to this embodiment. As shown in FIG. 18, flash memory cells MC0 to MC3 are sequentially arranged between select gates S2 and S1. Like the first embodiment, the flash memory cell MC includes no n-type impurity diffusion layers functioning as source and drain regions.

Further, in this embodiment, dummy cells DC are respectively formed between the select gate S1 and the adjacent flash memory cell MC3 and between the select gate S2 and the adjacent flash memory cell MC0. The dummy cell DC is a semiconductor element that has substantially the same structure as that of the flash memory cell MC but is not actually used to hold data. That is, the dummy cell DC includes a stacked gate that includes a charge accumulation layer (for example, floating gate FG) and a control gate CG formed above the charge accumulation layer with an inter-gate insulating film 22 interposed therebetween. The control gate CG is connected to a dummy word line DWL and a voltage is applied thereto by the row control circuit 3, for example. Like the flash memory cell MC, the dummy cell DC does not include n-type impurity diffusion layers functioning as source and drain regions. Therefore, n-type impurity diffusion layers 13 are not formed between the select gates S1, S2 and the dummy cells DC.

The peripheral portions of the stacked gates of the flash memory cells MC0 to MC3 and dummy cells DC are surrounded by an insulating film 30 and regions between the stacked gates of every adjacent flash memory cells MC are completely filled with the insulating film 30. Also, the peripheral portions of the gate electrodes of the select gates S1, S2 are surrounded by insulating films 30. Further, insulating films 32 are filled in regions between the stacked gates of the dummy cells DC and the gate electrodes of the respective select gates S1, S2. The insulating films 31, 32 are formed of a silicon oxide film, for example.

Figure 19:
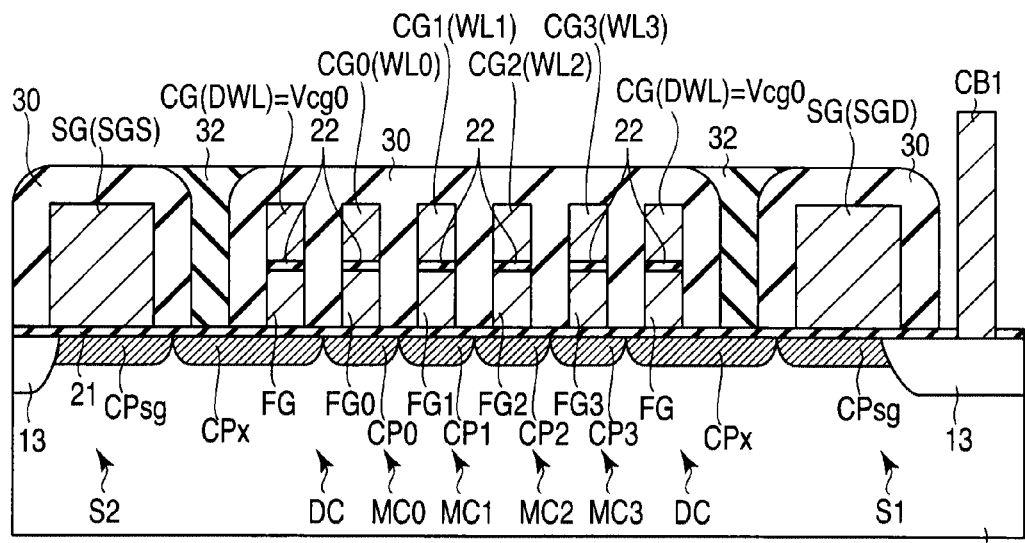

In the above structure, the state set when voltages are applied to the select gate lines SGD, SGS, word lines WL0 to WL3 and dummy word lines DWL to make a NAND memory unit MU conductive is shown in FIG. 19. FIG. 19 is a cross-sectional view showing the NAND memory unit MU and corresponds to the area explained in FIG. 18. In the example shown in FIG. 19, voltage Vcg1 or Vcg2 is applied to the word lines WL0 to WL3 as explained in the first embodiment. Vcg0 is applied to the dummy word lines DWL. Vcg0 is equivalent to or higher than Vcg1.

As shown in FIG. 19, inversion layers CP0 to CP3 are respectively formed in the flash memory cells MC0 to MC3 and adjacent ones of them contact with each other. Further, inversion layers CPsg are formed in the select gates S1, S2. The layers are the same as those of the first embodiment.

Further, in this embodiment, inversion layers CPx are formed in regions below the stacked gates of the dummy cells DC in the p-type well 12. The inversion layers CP3 and CPsg are connected via the inversion layer CPx and the inversion layers CP0 and CPsg are also connected via the inversion layer CPx. As a result, the NAND memory unit MU is made conductive.

The other structure and operation are the same as those explained in the first embodiment.

Figure 20:
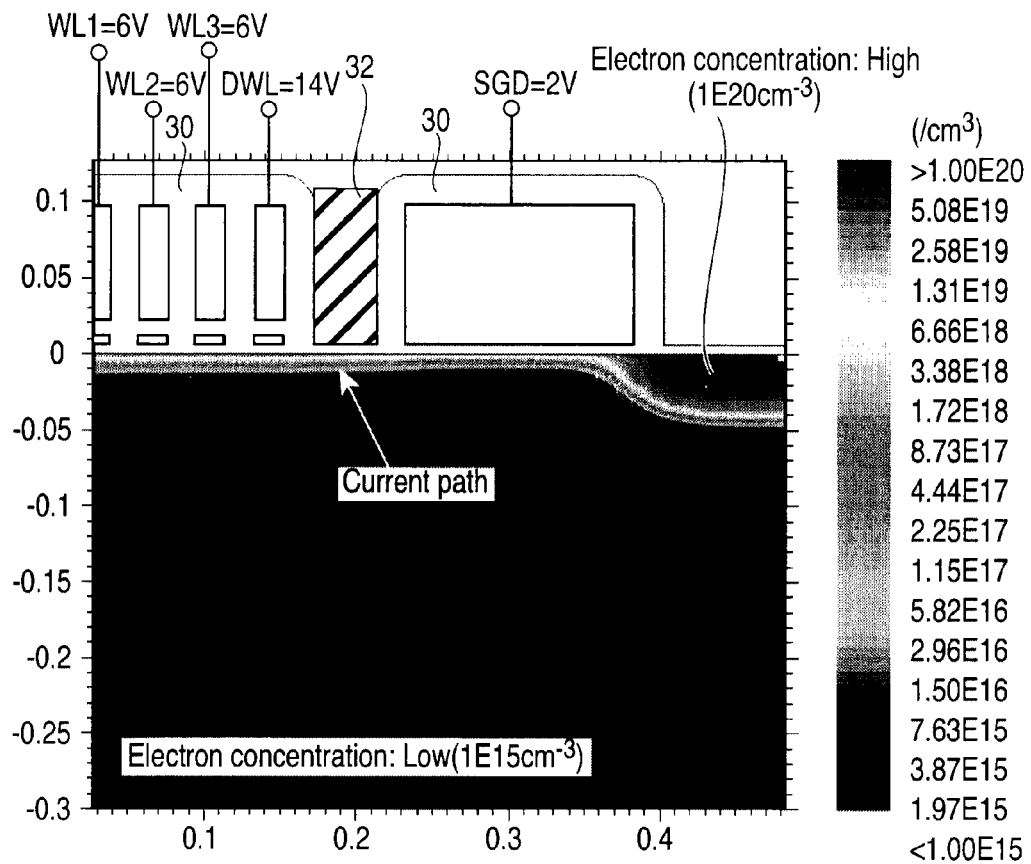

FIG. 20 is a cross-sectional view showing the NAND memory unit MU at the time of Vcg1=Vcg2=6 V, DWL (Vcg0)=14 V (>VPASS) and SGD=2 V in FIG. 19 and particularly shows a simulation result of electron concentration distribution in the p-type well 12. As shown in FIG. 20, a region having high electron concentration, that is, a current path is formed along the surface of the p-type well 12 in the NAND memory unit MU.

Figure 21:
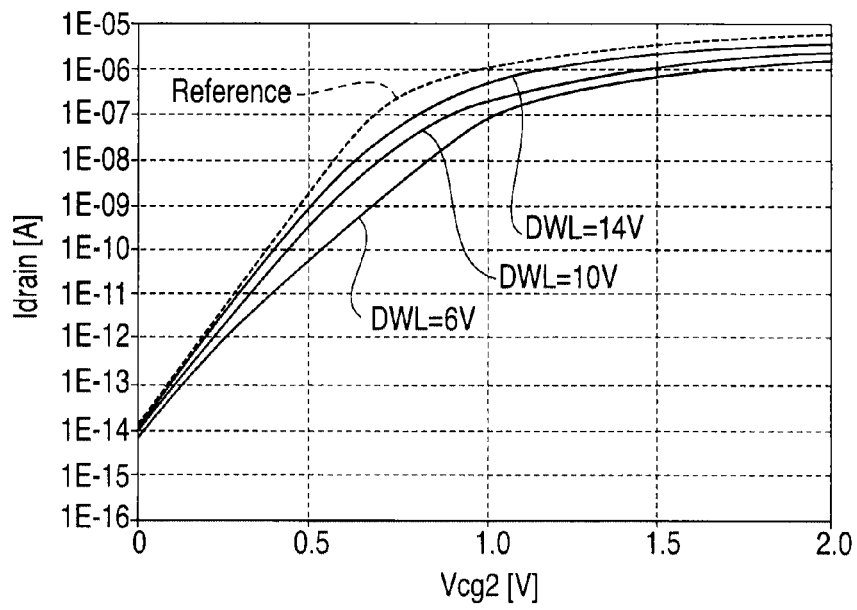
FIG. 21 is a graph showing IV characteristics of the NAND memory unit according to the sixth embodiment.

FIG. 21 is a graph showing an IV characteristic of the NAND memory unit MU when a voltage of the dummy word line DWL is set to 6 V, 10 V, 14 V in FIG. 20.

FIG. 21 is a graph showing simulation of current Idrain (current flowing from the bit line BL to the source line C-source) flowing through the select gate S1 when voltage Vsg of the select gate line SGD is changed between 0 and 2 V at the time of application of 0.7 V to the bit line BL. The distance between the select gate line SGD and the dummy word line DWL adjacent thereto is set to 80 nm. In FIG. 21, a case wherein n-type impurity diffusion layers are formed by use of As or the like as in the first embodiment (Reference) is also shown. As shown in FIG. 21, substantially the same characteristic as that obtained when the n-type impurity diffusion layers are formed is obtained by applying a voltage to the dummy word lines DWL. It is more preferable as the voltage applied to the dummy word lines DWL is set higher.

Figure 22:
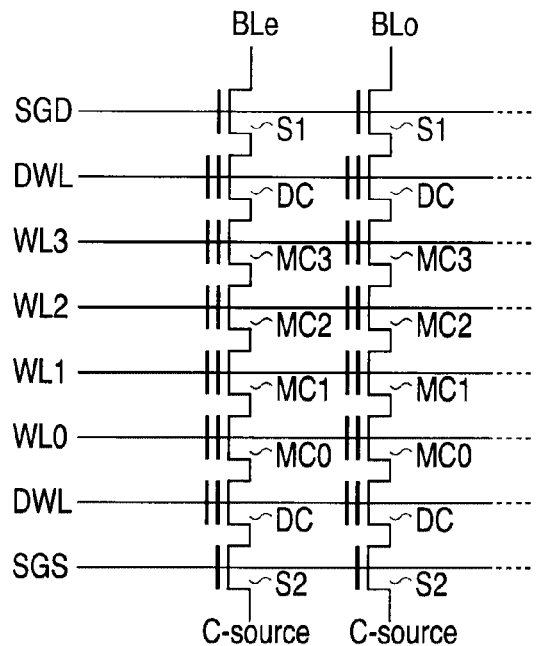
FIG. 22 is a circuit diagram of a memory cell array according to the sixth embodiment.

FIG. 22 is a circuit diagram of a partial region of a block BLK according to this embodiment. As shown in FIG. 22, dummy cells DC arranged on the same row are connected to the same dummy word line DWL.

<Effect>

As described above, with the structure according to the sixth embodiment, the NAND flash memory unit MU can be stably made conductive while a source region of the select gate S1 and a drain region of the select gate S2 are eliminated. The effect is explained below.

As is explained in the fifth embodiment, if the n-type impurity diffusion layers between the select gates S1, S2 and the flash memory cells MC adjacent thereto are eliminated, there occurs a possibility that the NAND flash memory unit MU cannot be made conductive.

In the structure according to this embodiment, the dummy cells DC are formed between the select gates S1, S2 and the adjacent flash memory cells MC. The inversion layers CPx are formed in the p-type well 12 by the dummy cells DC. The dummy cell DC is formed with the same size as that of the flash memory cell MC. Therefore, the distance between the dummy word line DWL and the select gate line SGD, SGS is larger than the distance between the adjacent word lines WL.

In this embodiment, for example, a voltage not lower than Vcg1 or VPASS is applied to the dummy word line DWL. As a result, the inversion layer CPx formed by the dummy cell DC expands in the p-type well 12 and an electrical connection can be made between the select gates S1, S2 and the respective flash memory cells MC.

<Modification>

In FIGS. 18 to 22, a case wherein the number of dummy cells DC arranged between the word line WL and the adjacent select gate line SGD or SGS is set to one is explained as an example. However, a plurality of dummy cells DC may be arranged.

Figure 23:
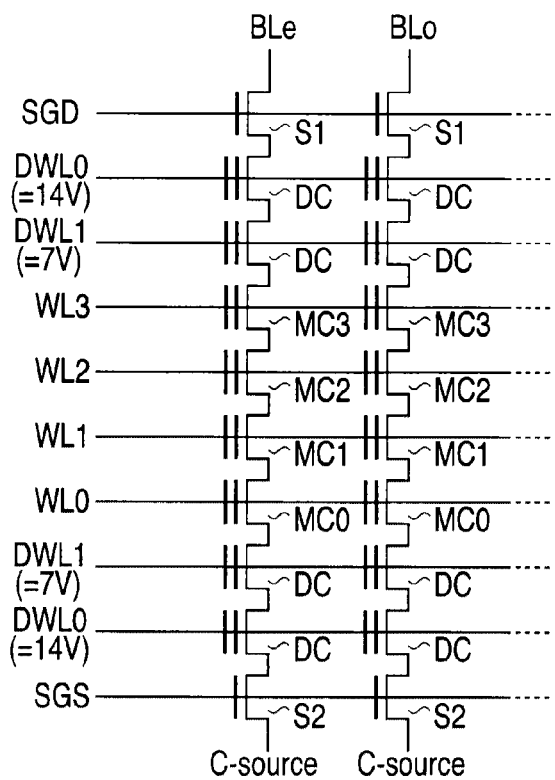
FIG. 23 is a circuit diagram of a memory cell array according to a modification of the sixth embodiment.

FIG. 23 is a circuit diagram of a memory cell array 1 when the number of dummy cells DC is set to 2. As shown in the drawing, two dummy cells DC are provided between the select gate S1 and the flash memory cell MC and respectively connected to dummy word lines DWL0, DWL1. Further, two dummy cells DC are provided between the select gate S2 and the flash memory cell MC and respectively connected to dummy word lines DWL0, DWL1.

With the above structure, voltages higher than those of the dummy word lines DWL1 are applied to the dummy word lines DWL0 arranged near the select gate lines SGD, SGS. For example, a voltage higher than Vcg1 or VPASS is applied to the dummy word line DWL0 and a voltage equivalent to Vcg1 or VPASS is applied to the dummy word line DWL1.

The number of dummy word lines DWL provided between the select gate line SGD or SGS and the word line WL adjacent thereto may be set to three or more. Also, in this case, a voltage applied to the dummy word line is set higher as the dummy word line DWL is arranged closer to the select gate line SGD, SGS.

As a result, a potential difference occurring between the word line WL and the dummy word line DWL can be reduced and the operation reliability of the NAND flash memory can be enhanced.

Further, the voltage applied to the dummy word line DWL can be adequately selected. For example, in FIG. 22, a value of voltage Vcg0 of the dummy word line DWL may be set higher than or equal to voltage Vcg1 at the data read time and the value may be set higher than or equal to voltage VPASS at the data write time or the same voltage may be used at the data read time and write time. As described before, both of voltage Vcg1 and voltage VPASS are voltages that turn on the flash memory cell MC irrespective of data to be held.

In this embodiment, an SOI substrate may be used as in the third embodiment, substrate potential Vsub can be applied as in the fourth embodiment or the above techniques can be adequately combined.

Further, with the structure according to this embodiment, the select gates S1, S2 can be eliminated. That is, the dummy cell DC can be used as the select gate S1, S2 by controlling the on/off state of the dummy cell DC according to the voltage applied to the dummy word line DWL. Conversely, the select gate S1, S2 may be formed to have the same function as the dummy cell DC. That is, when the select gates S1, S2 are turned on, voltage Vcg0 may be applied to the select gate lines SGD, SGS. As a result, inversion layers formed by the select gates S1, S2 can greatly expand and the effect of this embodiment can be attained without forming the dummy cells DC.

As described above, with the structures according to the first to sixth embodiments, the NAND flash memory includes the memory cells MC without a source and a drain region and first insulating films 30. The memory cells MC are arranged in adjacent to one another on the semiconductor substrate 10. Each of the memory cells MC includes the first gate electrode (FG, CG) including the charge accumulation layer FG. The first insulating layer 30 is formed on the semiconductor substrate 10 to fill the region between the first gate electrodes of the every adjacent memory cells MC. Current paths CPn−1, CPn+1 (FIG. 7) functioning as the source region or drain region of a selected memory cell MCn (FIG. 7) are formed when voltage (Vcg1 or VPASS) is applied to the first gate electrodes of the unselected memory cells MCn−1, MCn+1 (FIG. 7).

In the above structure, each memory cell MC can be operated to function as a MOS transistor while impurity diffusion layers functioning as the source and drain of the memory cell MC are made unnecessary. As a result, in a NAND flash memory that is extremely miniaturized, the operation reliability can be enhanced.

In each of the above embodiments, the configuration is not limited to the configuration in which a sense amplifier circuit is provided for each pair of bit lines. For example, the sense amplifier circuit 200 can be connected to each bit line.

Further, in the first to sixth embodiments, a case wherein impurity injected into the p-type well 12 is boron is explained as an example, but the impurity is not limited to boron if it is p-type impurity. In addition, the p-type impurity concentration is not limited to the example explained in the above embodiments. That is, whether the inversion layers CPn−1, CPn, CPn+1 can be adequately connected to one another or not depends on the mutual relation between the gate voltage of the flash memory cell MC, the distance between the adjacent gates, and the impurity concentration of the well, and the relation can be variously set. Therefore, for example, in FIG. 6, a case wherein the gate-gate distance Ls is set to 22 nm is explained as an example, but the embodiments are not limited to this case. Further, gate voltages applied at the data read time and write time are not limited to the values explained above and various examples are explained below.

First Example

Figure 24:
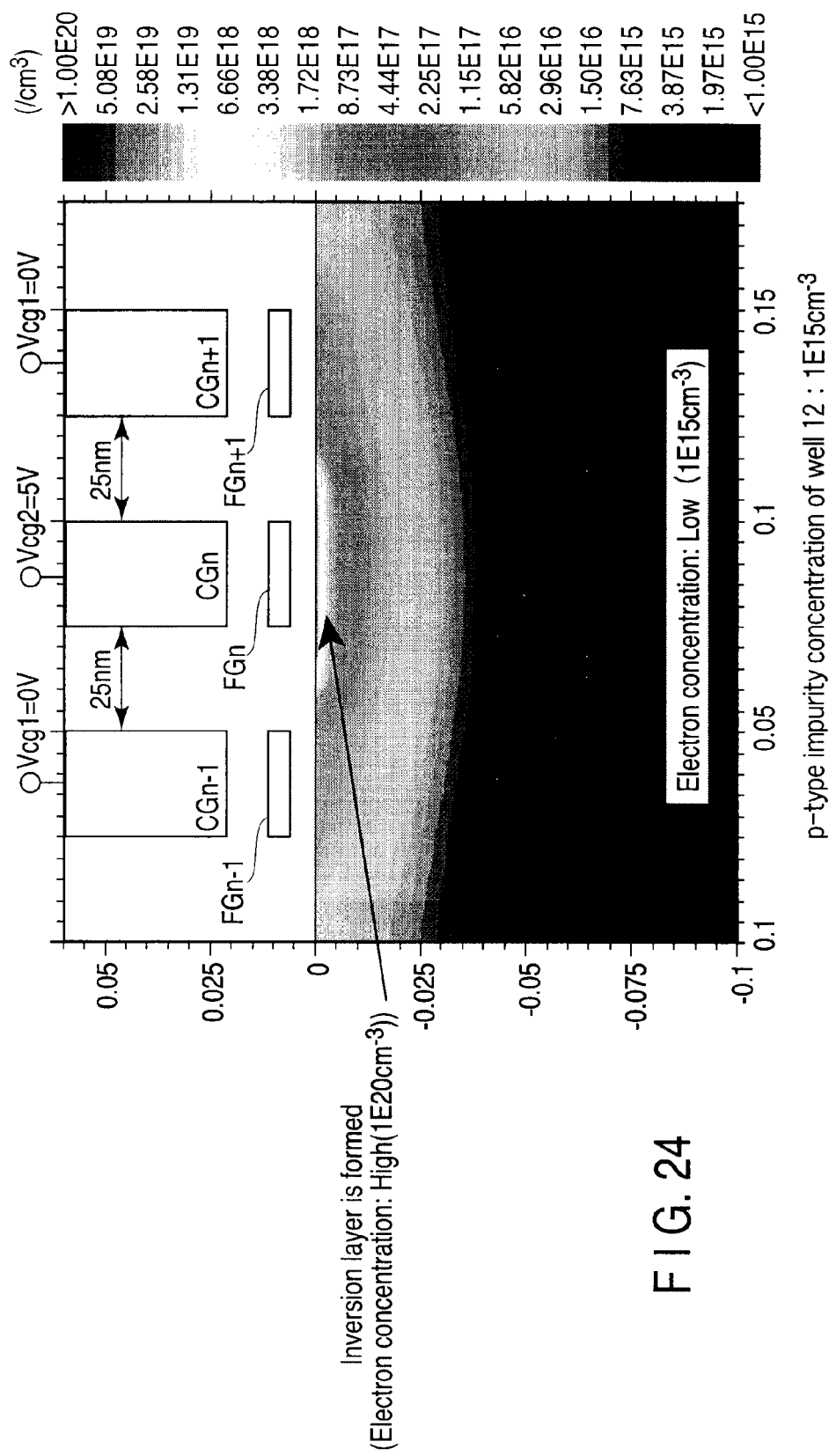
Figure 25:
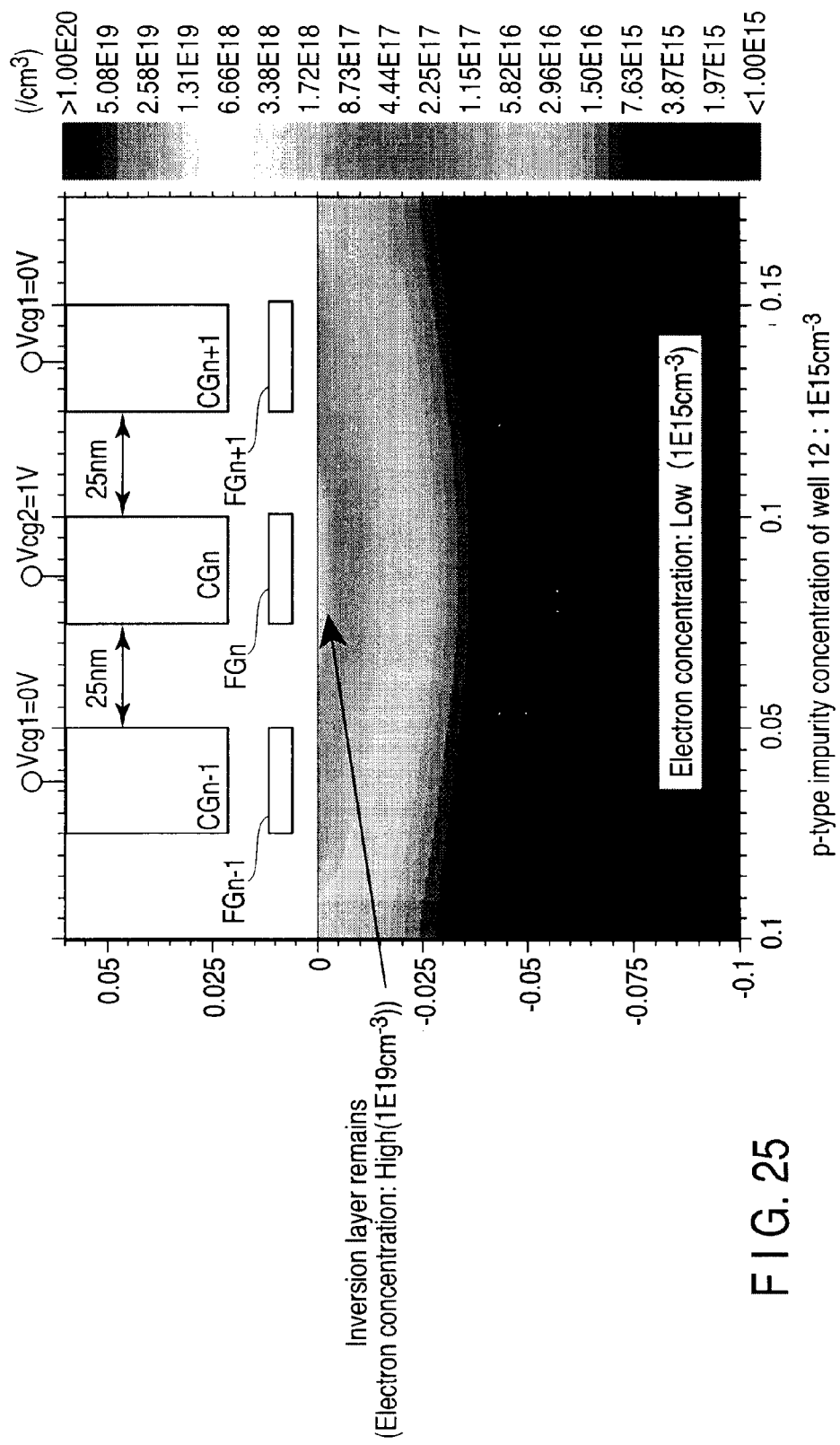

First, a first example is explained. FIGS. 24 and 25 are cross-sectional views showing a NAND memory unit MU when the gate-gate distance Ls is set to 25 nm, the p-type impurity concentration of the p-type well 12 is set to 1E15 $cm^{-3}$ and Vcg1 is set to 0V and particularly shows a simulation result of electron concentration distribution in the p-type well 12. Vcg2 is set to 5 V in FIG. 24 and Vcg2 is set to 1 V in FIG. 25. As shown in FIGS. 24 and 25, in this example, an inversion layer remains, of course, at the time of Vcg2=5 V and remains even when Vcg2 is lowered to 1 V.

Second Example

Figure 26:
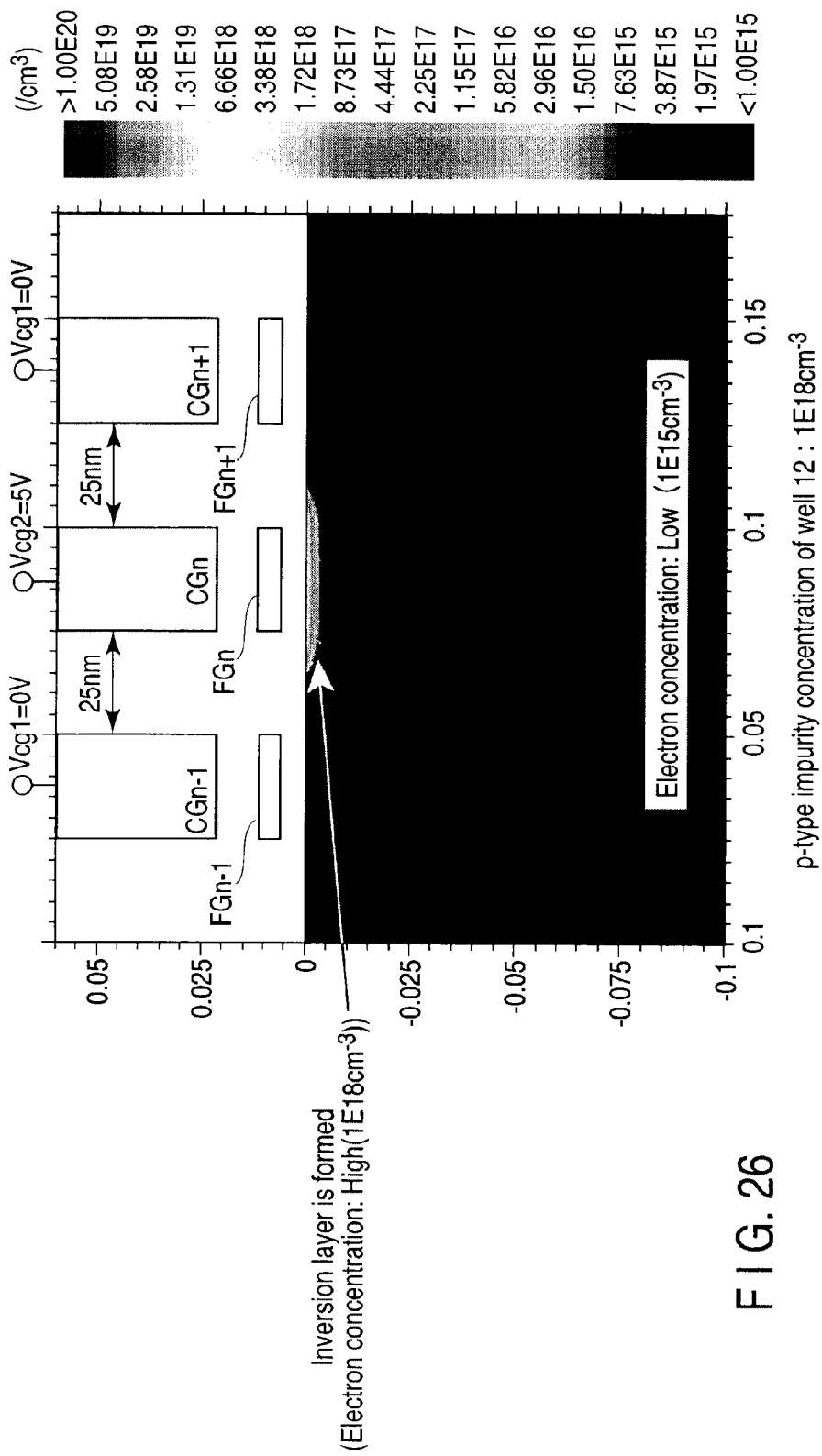
Figure 28:
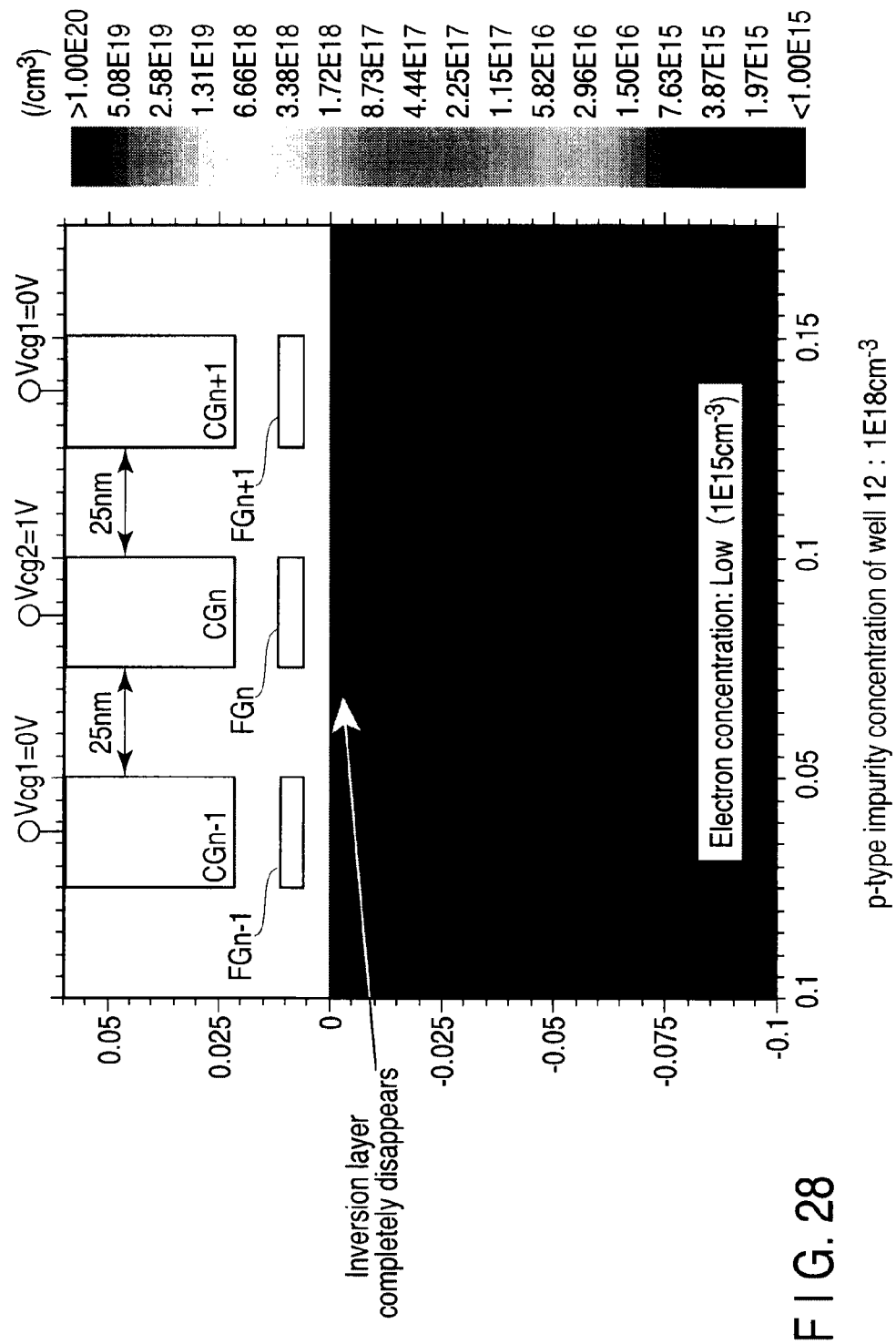

Next, a second example is explained. FIGS. 26 to 28 are cross-sectional views showing a NAND memory unit MU when the gate-gate distance Ls is set to 25 nm, the p-type impurity concentration of the p-type well 12 is set to 1E18 $cm^{-3}$ and Vcg1 is set to 0V and particularly shows a simulation result of electron concentration distribution in the p-type well 12. Vcg2 is set to 5 V in FIG. 26, Vcg2 is set to 3 V in FIG. 27 and Vcg2 is set to 1 V in FIG. 28. As shown in FIG. 26, an inversion layer is formed at the time of Vcg2=5 V. However, as shown in FIG. 27, the inversion layer starts to disappear at the time of Vcg2=3 V and the inversion layer completely disappears at the time of Vcg2=1 V. Therefore, in this case, it becomes necessary to set Vcg2 sufficiently higher in comparison with the first example.

Other Examples

Figure 29:
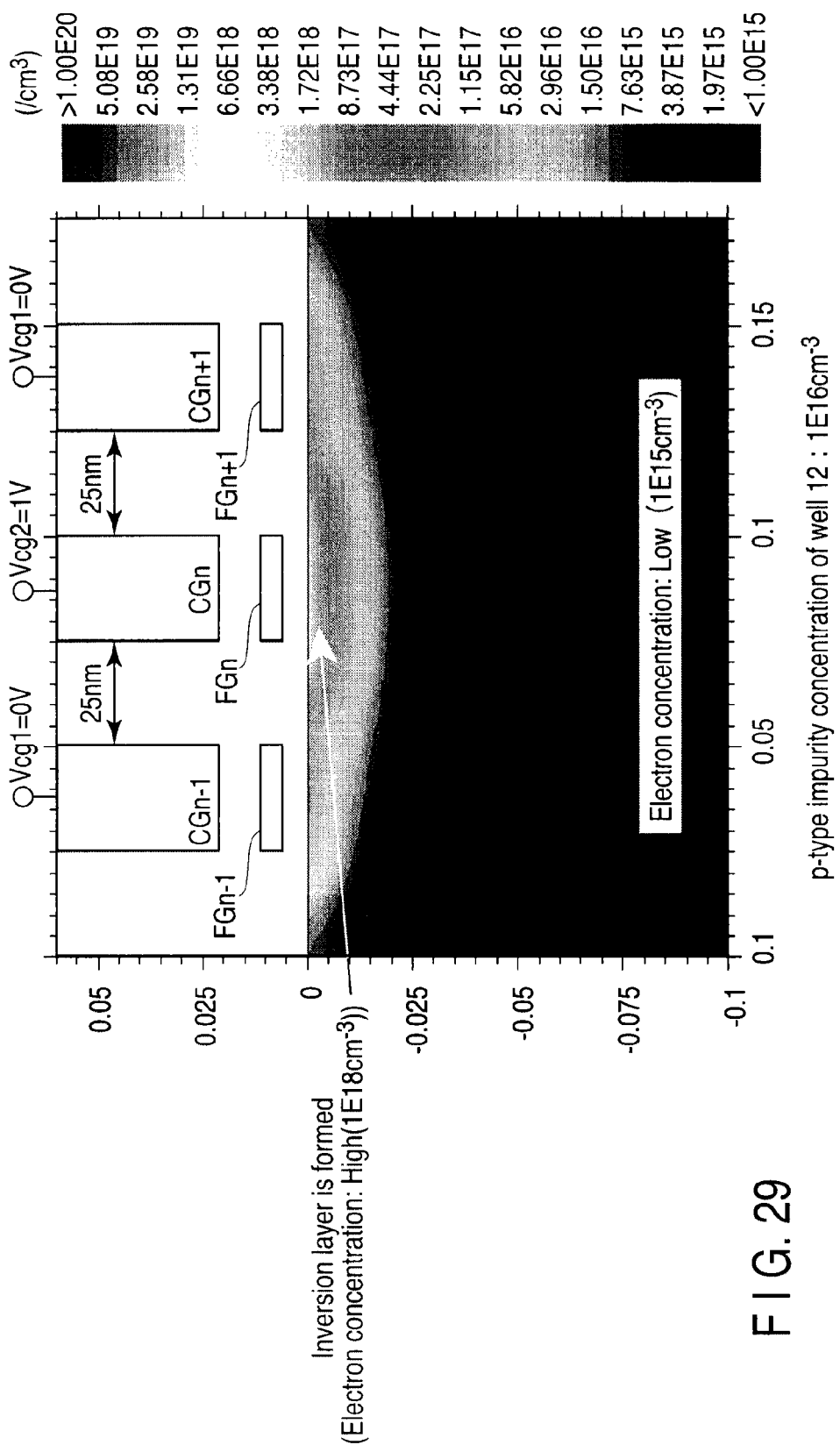

Next, another example is explained. FIGS. 29 and 30 are cross-sectional views showing a NAND memory unit MU in case where Ls=25 nm, Vcg1=0 V and Vcg2=1 V and particularly shows a simulation result of electron concentration distribution in the p-type well 12. In FIG. 29, the p-type impurity concentration of the p-type well 12 is set to 1E16 $cm^{-3}$ and, in FIG. 30, it is set to 1E17 $cm^{-3}$. As shown in FIGS. 29 and 30, it is understood that an inversion layer can be more sufficiently formed in the example of FIG. 29 in which the p-type impurity concentration is lower than in the example of FIG. 30 if the condition other than the p-type impurity concentration is the same.

Further, in the second embodiment, a case wherein the p-type well 12 is formed with a double-layered structure that includes the low-concentration region 12a and high-concentration region 12b and the depth of the low-concentration region 12a is 20 nm in FIG. 9A is explained as an example. However, the depth of the low-concentration region 12a is not limited to 20 nm and can be adequately set according to the way the depletion layer expands as is explained in FIGS. 24 to 30. This is also true in the third embodiment. Further, the p-type well 12 may be formed with a three-layered or four-layered structure and the p-type impurity concentration can be made higher as the depth from the surface becomes larger. In addition, the p-type well 12 is not necessarily required to include plural layers that are clearly separated and may be formed to have an impurity concentration profile in which the p-type impurity concentration continuously increases as the depth from the surface becomes larger, for example.

Further, in the third embodiment, an example in which the SOI substrate is used is explained with reference to FIG. 11. However, the insulating layer 23 is not necessarily limited to the silicon oxide film and another insulating film can be used.

In the fourth embodiment, a case wherein −5 V is applied as substrate voltage Vsub to read data is explained as an example with reference to FIG. 12. However, substrate voltage Vsub is not limited to −5 V and can be adequately set. Further, the voltage is not limited to a negative voltage and may be set to a positive voltage according to the way the depletion layer expands. Of course, this embodiment can be similarly applied to the write operation.

Additionally, in the fifth embodiment, an example in which $HfO_2$ or alumina is used as the high-dielectric-constant layer 31 and SiN is used instead thereof is explained. However, the material is not limited to the above materials and a material whose potential increases by coupling with the select gate line and word line to form the inversion layer CPx may be used.

In the sixth embodiment, a case wherein voltage Vcg0 applied to the dummy word line DWL is higher than VPASS or Vcg1 is explained as an example. However, the voltage is not limited to the above case if the voltage causes the inversion layer CPx to sufficiently expand and adequately connect the inversion layers CP0, CP3 and CPsg to one another.

Further, in the first to sixth embodiments, the NAND flash memory is explained as an example, but embodiments can be generally applied to a semiconductor memory that is miniaturized to cause a problem of short-circuit between the source and drain.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying drawings and their equivalents are intended to cover such forms or modifications as would fall within the scope and spirit of the inventions.

What is claimed is:

1. A semiconductor memory device comprising:
   a semiconductor substrate;
   memory cells without a source region and a drain region, the memory cells being arranged adjacent to one another on the semiconductor substrate, the memory cells including a first gate electrode including a charge accumulation layer, a current path functioning as a source region or a drain region of a selected memory cell being formed in the semiconductor substrate when a voltage is applied to the first gate electrode of one of unselected memory cells; and
   a first insulating film formed on the semiconductor substrate to fill a region between the first gate electrodes of the memory cells adjacent to each other.

2. The device according to claim 1, wherein the semiconductor substrate includes a first impurity region in a surface and a second impurity region formed under the first impurity region and having impurity concentration higher than that of the first impurity region, and
   a depth of the first impurity region is set to permit a bottom portion of a depletion layer formed in the first impurity region to reach the second impurity region when a read voltage is applied to the first gate electrode of one of the memory cells.

3. The device according to claim 1, wherein the semiconductor substrate includes a first impurity region in a surface and an insulating layer formed under the first impurity region, and
   a depth of the first impurity region is set to permit a bottom portion of a depletion layer formed in the first impurity region to reach the insulating layer when a read voltage is applied to the first gate electrode of one of the memory cells.

4. The device according to claim 1, further comprising a first voltage circuit which applies first and second voltages to the memory cells in a read operation,
   wherein a current path which connects the selected memory cell and the unselected memory cells to one another is formed in a surface of the semiconductor substrate according to data of the selected memory cell when the first voltage is applied to the first gate electrode of the selected memory cell and the second voltage is applied to the first gate electrode of one of the unselected memory cells by the first voltage circuit.

5. The device according to claim 4, further comprising a second voltage circuit which applies a third voltage to the semiconductor substrate in the read operation.

6. The device according to claim 1, further comprising:
   a select gate including a second gate electrode and arranged adjacent to one of the memory cells on the semiconductor substrate; and
   a second insulating film with a dielectric constant larger than that of a silicon oxide film and formed on the semiconductor substrate to fill a region between the first gate electrode of the one of the memory cells and the second gate electrode.

7. The device according to claim 6, wherein a distance between the second gate electrode and the first gate electrode adjacent thereto is larger than a distance between the adjacent first gate electrodes.

8. The device according to claim 1, further comprising:
   a first dummy element which includes a second gate electrode including a charge accumulation layer and arranged adjacent to one of the memory cells on the semiconductor substrate; and
   a select gate which is arranged adjacent to the first dummy element on the semiconductor substrate and includes a third gate electrode,
   wherein a first voltage which turns on the unselected memory cells irrespective of data is applied to the first gate electrodes of the unselected memory cells and a second voltage higher than the first voltage is applied to the first gate electrode of the selected memory cell in a write operation, and
   the first dummy element forms a current path which connects the select gate and the one of the memory cells by applying a third voltage higher than the first voltage to the second gate electrode.

9. The device according to claim 8, further comprising a second dummy element which is arranged between the one of the memory cells and the first dummy element on the semiconductor substrate and includes a fourth gate electrode including a charge accumulation layer,
   wherein the second dummy element forms a current path which connects the first dummy element and the one of the memory cells by applying a fourth voltage lower than the third voltage to the fourth gate electrode.

10. The device according to claim 8, wherein a distance between the second gate electrode and the third gate electrode is larger than a distance between the adjacent first gate electrodes, and
    a region between the second gate electrode and the third gate electrode is filled with a silicon oxide film.

11. The device according to claim 1, wherein only when a voltage is applied to the first gate electrode of one of unselected memory cells, the current path is formed in the semiconductor substrate.

12. A semiconductor memory device comprising:
    a first memory cell which is formed on a semiconductor substrate and includes a first gate electrode including a charge accumulation layer;
    a second memory cell which is formed adjacent to the first memory cell on the semiconductor substrate and includes a second gate electrode including a charge accumulation layer;

a first insulating film formed on the semiconductor substrate to fill a region between the first and second gate electrodes; and a first control circuit which forms first and second channels in the first and second memory cells, respectively, by applying voltages to the first and second gate electrodes and connects the first and second channels with each other.

13. The device according to claim 12, wherein the semiconductor substrate includes:

a first region formed in a surface and including impurities with a first conductivity type doped therein at first impurity concentration; and a second region formed under the first region and having impurities with the first conductivity type doped therein at second impurity concentration higher than the first impurity concentration, the first and second channels are formed in the first region, and depletion layers reach the second region when the first and second channels are formed.

14. The device according to claim 12, wherein the semiconductor substrate includes an insulating layer apart from a surface of the semiconductor substrate, and depletion layers reach the insulating layer when the first and second channels are formed.

15. The device according to claim 12, wherein the first control circuit applies a first voltage to the first gate electrode and applies a second voltage to the second gate electrode in a read operation, the second voltage turns on the second memory cell irrespective of data, the first voltage turns on the first memory cell according to data, and the first and second channels are connected with each other when both of the first and second memory cells are turned on.

16. The device according to claim 15, further comprising a second control circuit which applies a negative voltage to the semiconductor substrate in the read operation and/or a write operation.

17. The device according to claim 12, further comprising:

a select gate including a third gate electrode and formed adjacent to the second memory cell on the semiconductor substrate; and a second insulating film formed on the semiconductor substrate to fill a region between the second and third gate electrodes and having a dielectric constant higher than that of a silicon oxide film.

18. The device according to claim 17, wherein a distance between the second and third gate electrodes is larger than a distance between the first and second gate electrodes.

19. The device according to claim 12, further comprising:

a first dummy element which is formed adjacent to the second memory cell on the semiconductor substrate and includes a third gate electrode including a charge accumulation layer; and a select gate which is formed adjacent to the first dummy element on the semiconductor substrate and includes a fourth gate electrode, wherein the first control circuit forms third and fourth channels in the first dummy element and select gate by applying voltages to the third and fourth gate electrodes, connects the third and fourth channels with each other, and connects the second and third channels with each other.

20. The device according to claim 19, further comprising a second dummy element which is formed between the second memory cell and the first dummy element on the semiconductor substrate and includes a fifth gate electrode including a charge accumulation layer, wherein the first control circuit forms a fifth channel in the second dummy element by applying a voltage to the fifth gate electrode and connects the second channel with the third channel via the fifth channel.

21. The device according to claim 19, wherein a distance between the third and fourth gate electrodes is larger than a distance between the first and second gate electrodes, and a region between the third and fourth gate electrodes is filled with a silicon oxide film.

22. The device according to claim 12, wherein only when the voltage is applied to the first and second gate electrodes, a current path is formed to connect the first and second channels with each other.

* * * * *